(12) United States Patent
Mitchell

(10) Patent No.: US 11,876,042 B2
(45) Date of Patent: Jan. 16, 2024

(54) OMNIDIRECTIONAL FLEXIBLE LIGHT EMITTING DEVICE

(71) Applicant: FEIT ELECTRIC COMPANY, INC., Pico Rivera, CA (US)

(72) Inventor: John Mitchell, Andover, MA (US)

(73) Assignee: FEIT ELECTRIC COMPANY, INC., Pico Rivera, CA (US)

( * ) Notice: Subject to any disclaimer, the term of this patent is extended or adjusted under 35 U.S.C. 154(b) by 0 days.

(21) Appl. No.: 16/983,747

(22) Filed: Aug. 3, 2020

(65) Prior Publication Data
US 2022/0037237 A1     Feb. 3, 2022

(51) Int. Cl.
*H01L 23/498*     (2006.01)
*H01L 25/13*     (2006.01)

(52) U.S. Cl.
CPC .... *H01L 23/4985* (2013.01); *H01L 23/49838* (2013.01); *H01L 25/13* (2013.01)

(58) Field of Classification Search
None
See application file for complete search history.

(56) References Cited

U.S. PATENT DOCUMENTS

| | | |
|---|---|---|
| 3,607,463 A | 9/1971 | Kinoshita |
| 3,871,067 A | 3/1975 | Bogardus et al. |
| 3,938,177 A | 2/1976 | Hansen |
| 3,999,280 A | 12/1976 | Hansen |
| 4,026,692 A | 5/1977 | Bartholomew |
| 4,211,955 A | 7/1980 | Ray |
| 4,497,974 A | 2/1985 | Deckman |
| 4,727,289 A | 2/1988 | Uchida |
| 5,376,580 A | 12/1994 | Kish |
| 5,416,870 A | 5/1995 | Chun |
| 5,696,389 A | 12/1997 | Ishikawa |
| 5,708,280 A | 1/1998 | Lebby |
| 5,726,535 A | 3/1998 | Yan |
| 5,775,792 A | 7/1998 | Wiese |
| 5,779,924 A | 7/1998 | Krames |
| 5,780,867 A | 7/1998 | Fritz |

(Continued)

FOREIGN PATENT DOCUMENTS

| | | |
|---|---|---|
| AU | 754353 | 11/2002 |
| AU | 756072 | 1/2003 |

(Continued)

OTHER PUBLICATIONS

Adachi, S., "Properties of Gallium Arsenide: 18.4 Optical Funcations of AlGaAs: Tables", EMIS Datareview Series No. 2, pp. 513-528, Inspec (IEEE, New York, 1990).

(Continued)

*Primary Examiner* — Nishath Yasmeen
(74) *Attorney, Agent, or Firm* — Alston & Bird LLP

(57) ABSTRACT

An omnidirectional light emitting device is provided. An example device includes a flexible substrate having a substrate length, a first substrate surface, and a second substrate surface. The flexible substrate is configured to be flexibly wrenched about a longitudinal axis that is parallel to the substrate length. The example device further includes a plurality of LED packages disposed on the first substrate surface. Each LED package of the plurality of LED packages is configured to emit light outward from the flexible substrate.

15 Claims, 9 Drawing Sheets

(56) References Cited

U.S. PATENT DOCUMENTS

| | | |
|---|---|---|
| 5,814,870 A | 9/1998 | Spaeth |
| 5,886,401 A | 3/1999 | Liu |
| 5,905,275 A | 5/1999 | Nunoue |
| 5,924,784 A | 7/1999 | Chliwnyj |
| 5,925,898 A | 7/1999 | Späth |
| 5,932,048 A | 8/1999 | Furukawa |
| 5,952,681 A | 9/1999 | Chen |
| 5,959,316 A | 9/1999 | Lowery et al. |
| 5,998,232 A | 12/1999 | Maruska |
| 5,998,925 A | 12/1999 | Shimizu |
| 6,015,719 A | 1/2000 | Kish |
| 6,042,248 A | 3/2000 | Hannah |
| 6,066,861 A | 5/2000 | Hoehn et al. |
| 6,091,085 A | 7/2000 | Lester |
| 6,133,589 A | 10/2000 | Krames |
| 6,155,699 A | 12/2000 | Miller |
| 6,218,807 B1 | 4/2001 | Sakaue et al. |
| 6,222,207 B1 | 4/2001 | Carter-Coman et al. |
| 6,229,160 B1 | 5/2001 | Krames |
| 6,252,254 B1 | 6/2001 | Soules |
| 6,262,534 B1 | 7/2001 | Johnson, Jr. |
| 6,310,364 B1 | 10/2001 | Uemura |
| 6,331,063 B1 | 12/2001 | Kamada |
| 6,335,548 B1 | 1/2002 | Roberts |
| 6,357,889 B1 | 3/2002 | Duggal |
| 6,369,506 B1 | 4/2002 | Hata |
| 6,373,188 B1 | 4/2002 | Johnson |
| 6,376,851 B1 | 4/2002 | Worley |
| 6,396,082 B1 | 5/2002 | Fukasawa |
| 6,417,019 B1 | 7/2002 | Mueller |
| 6,452,217 B1 | 9/2002 | Wojnarowski |
| 6,482,664 B1 | 11/2002 | Lee |
| 6,483,196 B1 | 11/2002 | Wojnarowski |
| 6,492,725 B1 | 12/2002 | Loh et al. |
| 6,495,862 B1 | 12/2002 | Okazaki et al. |
| 6,509,584 B2 | 1/2003 | Suzuki |
| 6,515,308 B1 | 2/2003 | Kneissl |
| 6,523,978 B1 | 2/2003 | Huang |
| 6,525,464 B1 | 2/2003 | Chin |
| 6,547,423 B2 | 4/2003 | Marshall |
| 6,548,956 B2 | 4/2003 | Forrest |
| 6,550,953 B1 | 4/2003 | Ichikawa |
| 6,568,834 B1 | 5/2003 | Scianna |
| 6,569,544 B1 | 5/2003 | Alain |
| 6,573,530 B1 | 6/2003 | Sargent |
| 6,573,537 B1 | 6/2003 | Steigerwald |
| 6,583,550 B2 | 6/2003 | Iwasa |
| 6,586,882 B1 | 7/2003 | Harbers |
| 6,603,151 B2 | 8/2003 | Lin |
| 6,603,258 B1 | 8/2003 | Mueller-Mach et al. |
| 6,607,286 B2 | 8/2003 | West |
| 6,607,931 B2 | 8/2003 | Streubel |
| 6,608,333 B1 | 8/2003 | Lee |
| 6,608,439 B1 | 8/2003 | Sokolik |
| 6,614,058 B2 | 9/2003 | Lin |
| 6,635,902 B1 | 10/2003 | Lin |
| 6,639,360 B2 | 10/2003 | Roberts |
| 6,642,618 B2 | 11/2003 | Yagi et al. |
| 6,649,939 B1 | 11/2003 | Wirth |
| 6,657,236 B1 | 12/2003 | Thibeault |
| 6,657,767 B2 | 12/2003 | Bonardi |
| 6,661,167 B2 | 12/2003 | Eliashevich |
| 6,661,578 B2 | 12/2003 | Hedrick |
| 6,664,571 B1 | 12/2003 | Amann |
| 6,674,096 B2 | 1/2004 | Sommers |
| 6,677,610 B2 | 1/2004 | Choi |
| 6,682,950 B2 | 1/2004 | Yang |
| 6,686,218 B2 | 2/2004 | Lin |
| 6,686,676 B2 | 2/2004 | McNulty |
| 6,717,362 B1 | 4/2004 | Lee |
| 6,719,936 B2 | 4/2004 | Carlton |
| 6,729,746 B2 | 5/2004 | Suehiro |
| 6,730,939 B2 | 5/2004 | Eisert |
| 6,737,532 B2 | 5/2004 | Chen |
| 6,737,681 B2 | 5/2004 | Koda |
| 6,746,295 B2 | 6/2004 | Sorg |
| 6,759,804 B2 | 7/2004 | Ellens |
| 6,762,436 B1 | 7/2004 | Huang |
| 6,765,236 B2 | 7/2004 | Sakurai |
| 6,777,871 B2 | 8/2004 | Duggal |
| 6,784,460 B2 | 8/2004 | Ng |
| 6,791,116 B2 | 9/2004 | Takahashi |
| 6,791,119 B2 | 9/2004 | Slater, Jr. |
| 6,791,259 B1 | 9/2004 | Stokes |
| 6,794,685 B2 | 9/2004 | Hata |
| 6,803,607 B1 | 10/2004 | Chan |
| 6,809,345 B2 | 10/2004 | Watanabe |
| 6,812,500 B2 | 11/2004 | Reeh et al. |
| 6,841,934 B2 | 1/2005 | Wang |
| 6,844,572 B2 | 1/2005 | Sawaki |
| 6,847,057 B1 | 1/2005 | Gardner et al. |
| 6,853,151 B2 | 2/2005 | Leong |
| 6,874,910 B2 | 4/2005 | Sugimoto |
| 6,893,890 B2 | 5/2005 | Takekuma |
| 6,902,830 B2 | 6/2005 | Thompson |
| 6,909,108 B2 | 6/2005 | Tang |
| 6,914,267 B2 | 7/2005 | Fukasawa |
| 6,914,268 B2 | 7/2005 | Shei |
| 6,917,057 B2 | 7/2005 | Stokes |
| 6,921,927 B2 | 7/2005 | Ng |
| 6,922,424 B2 | 7/2005 | Weigert |
| 6,932,495 B2 | 8/2005 | Sloan |
| 6,936,761 B2 | 8/2005 | Pichler |
| 6,961,190 B1 | 11/2005 | Tamaoki |
| 6,964,877 B2 | 11/2005 | Chen |
| 6,969,874 B1 | 11/2005 | Gee |
| 6,969,946 B2 | 11/2005 | Steranka |
| 6,972,208 B2 | 12/2005 | Hsieh |
| 6,972,212 B2 | 12/2005 | Eisert |
| 6,972,438 B2 | 12/2005 | Li et al. |
| 6,982,522 B2 | 1/2006 | Omoto |
| 6,987,613 B2 | 1/2006 | Pocius |
| 6,995,402 B2 | 2/2006 | Ludowise et al. |
| 6,997,580 B2 | 2/2006 | Wong |
| 6,998,281 B2 | 2/2006 | Taskar |
| 7,008,858 B2 | 3/2006 | Liu |
| 7,009,213 B2 | 3/2006 | Camras |
| 7,009,217 B2 | 3/2006 | Liu |
| 7,015,514 B2 | 3/2006 | Baur |
| 7,018,859 B2 | 3/2006 | Liao |
| 7,019,456 B2 | 3/2006 | Yasukawa |
| 7,026,261 B2 | 4/2006 | Hirose |
| 7,026,657 B2 | 4/2006 | Bogner |
| 7,030,552 B2 | 4/2006 | Chao et al. |
| 7,053,419 B1 | 5/2006 | Camras |
| 7,070,304 B2 | 7/2006 | Imai |
| 7,071,034 B2 | 7/2006 | Ueda |
| 7,072,096 B2 | 7/2006 | Holman |
| 7,084,435 B2 | 8/2006 | Sugimoto |
| 7,086,756 B2 | 8/2006 | Maxik |
| 7,091,653 B2 | 8/2006 | Ouderkirk |
| 7,091,661 B2 | 8/2006 | Ouderkirk |
| 7,098,589 B2 | 8/2006 | Erchak |
| 7,102,213 B2 | 9/2006 | Sorg |
| 7,105,860 B2 | 9/2006 | Shei |
| 7,119,271 B2 | 10/2006 | King |
| 7,126,159 B2 | 10/2006 | Itai |
| 7,129,635 B2 | 10/2006 | Tsujimura |
| 7,135,709 B1 | 11/2006 | Wirth |
| 7,157,745 B2 | 1/2007 | Blonder |
| 7,161,189 B2 | 1/2007 | Wu |
| 7,166,873 B2 | 1/2007 | Okazaki |
| 7,188,981 B2 | 3/2007 | Barros |
| 7,195,991 B2 | 3/2007 | Karnutsch |
| 7,202,506 B1 | 4/2007 | DenBaars et al. |
| 7,210,806 B2 | 5/2007 | Holman |
| 7,210,818 B2 | 5/2007 | Luk |
| 7,217,004 B2 | 5/2007 | Park |
| 7,223,620 B2 | 5/2007 | Jäger |
| 7,223,998 B2 | 5/2007 | Schwach |
| 7,226,189 B2 | 6/2007 | Lee |
| 7,227,304 B2 | 6/2007 | Tsujimura |
| 7,235,817 B2 | 6/2007 | Yano |
| 7,244,630 B2 | 7/2007 | Krames et al. |

(56) References Cited

U.S. PATENT DOCUMENTS

| | | | |
|---|---|---|---|
| 7,250,728 | B2 | 7/2007 | Chen et al. |
| 7,253,447 | B2 | 8/2007 | Oishi et al. |
| 7,253,448 | B2 | 8/2007 | Roberts |
| 7,262,440 | B2 | 8/2007 | Choi |
| 7,264,378 | B2 | 9/2007 | Loh |
| 7,268,371 | B2 | 9/2007 | Krames et al. |
| 7,273,291 | B2 | 9/2007 | Kim et al. |
| 7,281,818 | B2 | 10/2007 | You |
| 7,281,860 | B2 | 10/2007 | Fujita |
| 7,282,853 | B2 | 10/2007 | Yano |
| 7,286,296 | B2 | 10/2007 | Chaves |
| 7,288,420 | B1 | 10/2007 | Yamazaki et al. |
| 7,291,864 | B2 | 11/2007 | Weisbuch et al. |
| 7,300,217 | B2 | 11/2007 | Mizaguchi |
| 7,309,882 | B2 | 12/2007 | Chen |
| 7,312,573 | B2 | 12/2007 | Chang |
| 7,317,210 | B2 | 1/2008 | Brabec |
| 7,319,246 | B2 | 1/2008 | Soules |
| 7,323,704 | B2 | 1/2008 | Itai |
| 7,329,982 | B2 | 2/2008 | Conner |
| 7,331,697 | B1 | 2/2008 | Hulse |
| 7,332,747 | B2 | 2/2008 | Uemura |
| 7,341,878 | B2 | 3/2008 | Krames et al. |
| 7,344,902 | B2 | 3/2008 | Basin et al. |
| 7,344,958 | B2 | 3/2008 | Murai |
| 7,345,298 | B2 | 3/2008 | Weisbuch et al. |
| 7,350,936 | B2 | 4/2008 | Ducharme |
| 7,352,006 | B2 | 4/2008 | Beeson |
| 7,354,174 | B1 | 4/2008 | Yan |
| 7,358,537 | B2 | 4/2008 | Yeh et al. |
| 7,358,539 | B2 | 4/2008 | Venugopalan |
| 7,358,599 | B2 | 4/2008 | Nagura et al. |
| 7,361,938 | B2 | 4/2008 | Mueller et al. |
| 7,374,958 | B2 | 5/2008 | Pan |
| 7,380,962 | B2 | 6/2008 | Chaves |
| 7,390,117 | B2 | 6/2008 | Leatherdale |
| 7,391,153 | B2 | 6/2008 | Suehiro |
| 7,396,142 | B2 | 7/2008 | Laizure, Jr. |
| 7,397,177 | B2 | 7/2008 | Takahashi |
| 7,400,439 | B2 | 7/2008 | Holman |
| 7,408,204 | B1 | 8/2008 | Tung |
| 7,414,270 | B2 | 8/2008 | Kim |
| 7,427,145 | B2 | 9/2008 | Jang |
| 7,431,477 | B2 | 10/2008 | Chou |
| 7,435,997 | B2 | 10/2008 | Arndt |
| 7,449,789 | B2 | 11/2008 | Chen |
| 7,456,483 | B2 | 11/2008 | Tsukamoto et al. |
| 7,463,419 | B2 | 12/2008 | Weber |
| 7,465,962 | B2 | 12/2008 | Kametani |
| 7,479,662 | B2 | 1/2009 | Soules et al. |
| 7,479,664 | B2 | 1/2009 | Williams |
| 7,482,638 | B2 | 1/2009 | Wall, Jr. |
| 7,489,068 | B2 | 2/2009 | Hsieh |
| 7,489,075 | B2 | 2/2009 | Lee |
| 7,498,734 | B2 | 3/2009 | Suehiro |
| 7,504,671 | B2 | 3/2009 | Ishidu |
| 7,507,001 | B2 | 3/2009 | Kit |
| 7,510,289 | B2 | 3/2009 | Takekuma |
| 7,514,723 | B2 | 4/2009 | Arndt et al. |
| 7,518,149 | B2 | 4/2009 | Maaskant |
| 7,521,782 | B2 | 4/2009 | Ishii |
| 7,531,835 | B2 | 5/2009 | Heeger |
| 7,534,002 | B2 | 5/2009 | Yamaguchi |
| 7,534,634 | B2 | 5/2009 | Jäger |
| 7,545,042 | B2 | 6/2009 | Yang |
| 7,582,910 | B2 | 9/2009 | David et al. |
| 7,585,083 | B2 | 9/2009 | Kim |
| 7,586,127 | B2 | 9/2009 | Nomura |
| 7,602,118 | B2 | 10/2009 | Cok |
| 7,626,255 | B2 | 12/2009 | Weekamp et al. |
| 7,646,146 | B2 | 1/2010 | Cok |
| 7,666,715 | B2 | 2/2010 | Brunner |
| 7,687,813 | B2 | 3/2010 | Nakamura |
| 7,692,205 | B2 | 4/2010 | Wang |
| 7,693,360 | B2 | 4/2010 | Shimizu |
| 7,704,763 | B2 | 4/2010 | Fujii et al. |
| 7,710,016 | B2 | 5/2010 | Miki |
| 7,717,589 | B2 | 5/2010 | Nishioka |
| 7,719,020 | B2 | 5/2010 | Murai et al. |
| 7,719,182 | B2 | 5/2010 | Cok |
| 7,723,740 | B2 | 5/2010 | Takashima et al. |
| 7,733,011 | B2 | 6/2010 | Cina |
| 7,742,677 | B2 | 6/2010 | Eberhard |
| 7,745,986 | B2 | 6/2010 | Ito |
| 7,748,879 | B2 | 7/2010 | Koike |
| 7,755,096 | B2 | 7/2010 | Weisbuch |
| 7,759,140 | B2 | 7/2010 | Lee et al. |
| 7,766,508 | B2 | 8/2010 | Villard |
| 7,772,597 | B2 | 8/2010 | Inoue |
| 7,781,787 | B2 | 8/2010 | Suehiro |
| 7,781,789 | B2 | 8/2010 | DenBaars |
| 7,824,937 | B2 | 11/2010 | Suehiro |
| 7,842,526 | B2 | 11/2010 | Hadame |
| 7,847,302 | B2 | 12/2010 | Basin et al. |
| 7,851,815 | B2 | 12/2010 | Diamantidis |
| 7,860,356 | B2 | 12/2010 | Van Montfort |
| 7,868,341 | B2 | 1/2011 | Diana |
| 7,872,275 | B2 | 1/2011 | Diamantidis |
| 7,872,414 | B2 | 1/2011 | Adachi et al. |
| 7,875,897 | B2 | 1/2011 | Suehiro |
| 7,964,883 | B2 | 1/2011 | Mazzochette |
| 7,932,111 | B2 | 4/2011 | Edmond |
| 7,950,831 | B2 | 5/2011 | Moon |
| 7,956,371 | B2 | 6/2011 | DenBaars et al. |
| RE42,636 | E | 8/2011 | Chen |
| 7,994,527 | B2 | 8/2011 | DenBaars et al. |
| 7,998,773 | B2 | 8/2011 | Abramov et al. |
| 8,022,423 | B2 | 9/2011 | Nakamura |
| 8,035,117 | B2 | 10/2011 | DenBaars |
| 8,039,849 | B2 | 10/2011 | Lam |
| 8,071,997 | B2 | 12/2011 | Scotch et al. |
| 8,109,635 | B2 | 2/2012 | Allon |
| 8,158,987 | B2 | 4/2012 | Nabekura |
| 8,162,493 | B2 | 4/2012 | Skiver |
| 8,212,262 | B2 | 7/2012 | Emerson |
| 8,258,519 | B2 | 9/2012 | Hsu |
| 8,294,166 | B2 | 10/2012 | Nakamura |
| 8,366,295 | B2 | 2/2013 | Tanda et al. |
| 8,368,109 | B2 | 2/2013 | Iso |
| 8,378,368 | B2 | 2/2013 | Hsu |
| 8,395,167 | B2 | 3/2013 | Kang |
| 8,405,307 | B2 | 3/2013 | Yano |
| 8,455,909 | B2 | 6/2013 | Negley |
| 8,541,788 | B2 | 9/2013 | DenBaars |
| 8,558,446 | B2 | 10/2013 | Miki |
| 8,610,145 | B2 | 12/2013 | Yano |
| 8,637,892 | B2 | 1/2014 | Egoshi |
| 8,710,535 | B2 | 4/2014 | Jo |
| 8,835,959 | B2 | 9/2014 | Nakamura |
| 8,860,051 | B2 | 10/2014 | Fellows et al. |
| 8,882,290 | B2 | 11/2014 | Hsieh |
| 8,889,440 | B2 | 11/2014 | Chen |
| 9,276,156 | B2 | 3/2016 | King |
| 9,666,772 | B2 | 5/2017 | Ibbestson et al. |
| 9,705,059 | B2 | 7/2017 | Park |
| 9,752,734 | B2 | 9/2017 | Tanda |
| D818,153 | S | 5/2018 | Feit |
| 10,103,306 | B2 | 10/2018 | Kim |
| 10,217,916 | B2 | 2/2019 | Nakamura |
| 10,312,422 | B2 | 6/2019 | Camras |
| 10,374,003 | B2 | 8/2019 | Choi |
| 10,724,690 | B2 | 7/2020 | Feit |
| 2001/0002049 | A1 | 5/2001 | Reeh et al. |
| 2001/0010598 | A1 | 8/2001 | Aritake |
| 2001/0033135 | A1 | 10/2001 | Duggal et al. |
| 2002/0006040 | A1 | 1/2002 | Kamada et al. |
| 2002/0008452 | A1 | 1/2002 | Coushaine et al. |
| 2002/0066905 | A1 | 6/2002 | Wang |
| 2002/0085601 | A1 | 7/2002 | Wang et al. |
| 2002/0123204 | A1 | 9/2002 | Torvik |
| 2002/0131726 | A1 | 9/2002 | Lin |
| 2002/0141006 | A1 | 10/2002 | Pocius |
| 2002/0158578 | A1 | 10/2002 | Eliashevich et al. |
| 2002/0171087 | A1 | 11/2002 | Krames |

(56) References Cited

U.S. PATENT DOCUMENTS

| | | |
|---|---|---|
| 2003/0010975 A1 | 1/2003 | Gibb et al. |
| 2003/0015959 A1 | 1/2003 | Tomoda |
| 2003/0031015 A1 | 2/2003 | Ishibashi |
| 2003/0039119 A1 | 2/2003 | Cao |
| 2003/0057444 A1 | 3/2003 | Niki |
| 2003/0057832 A1 | 3/2003 | Juestel et al. |
| 2003/0075723 A1 | 4/2003 | Heremans et al. |
| 2003/0100140 A1 | 5/2003 | Lin et al. |
| 2003/0124754 A1 | 7/2003 | Farahi et al. |
| 2003/0141506 A1 | 7/2003 | Sano et al. |
| 2003/0151361 A1 | 8/2003 | Ishizaka |
| 2003/0193803 A1 | 10/2003 | Lin |
| 2003/0213969 A1 | 11/2003 | Wang et al. |
| 2003/0215766 A1 | 11/2003 | Fischer |
| 2004/0000727 A1 | 1/2004 | Hsu |
| 2004/0007709 A1 | 1/2004 | Kondo |
| 2004/0007980 A1 | 1/2004 | Shibata |
| 2004/0007981 A1 | 1/2004 | Shibata |
| 2004/0008525 A1 | 1/2004 | Shibata |
| 2004/0036074 A1 | 2/2004 | Kondo |
| 2004/0037079 A1* | 2/2004 | Luk .......................... F21S 4/26 362/249.14 |
| 2004/0037080 A1 | 2/2004 | Luk |
| 2004/0041161 A1 | 3/2004 | Kim |
| 2004/0046179 A1 | 3/2004 | Baur |
| 2004/0070014 A1 | 4/2004 | Lin et al. |
| 2004/0075382 A1 | 4/2004 | Stegamat |
| 2004/0079408 A1 | 4/2004 | Fetzer et al. |
| 2004/0089868 A1 | 5/2004 | Hon |
| 2004/0094772 A1 | 5/2004 | Hon |
| 2004/0095502 A1 | 5/2004 | Losehand et al. |
| 2004/0109327 A1 | 6/2004 | Coushaine |
| 2004/0155565 A1 | 8/2004 | Holder |
| 2004/0164311 A1 | 8/2004 | Uemura |
| 2004/0173807 A1 | 9/2004 | Tian |
| 2004/0173810 A1 | 9/2004 | Lin et al. |
| 2004/0184495 A1 | 9/2004 | Kondo et al. |
| 2004/0188700 A1 | 9/2004 | Fukasawa |
| 2004/0188791 A1 | 9/2004 | Horng et al. |
| 2004/0211970 A1 | 10/2004 | Hayashimoto et al. |
| 2004/0239242 A1 | 12/2004 | Mano |
| 2004/0239611 A1 | 12/2004 | Huang |
| 2004/0245531 A1 | 12/2004 | Fuii et al. |
| 2004/0257797 A1 | 12/2004 | Suehiro et al. |
| 2004/0263064 A1 | 12/2004 | Huang |
| 2005/0007010 A1 | 1/2005 | Lee |
| 2005/0029528 A1 | 2/2005 | Ishikawa |
| 2005/0030761 A1 | 2/2005 | Burgess |
| 2005/0032257 A1 | 2/2005 | Camras et al. |
| 2005/0035354 A1 | 2/2005 | Lin et al. |
| 2005/0040410 A1 | 2/2005 | Ledentsov et al. |
| 2005/0062830 A1 | 3/2005 | Taki |
| 2005/0077532 A1 | 4/2005 | Ota et al. |
| 2005/0082546 A1 | 4/2005 | Lee et al. |
| 2005/0082562 A1 | 4/2005 | Ou |
| 2005/0093008 A1 | 5/2005 | Suehiro et al. |
| 2005/0111240 A1 | 5/2005 | Yonekubo |
| 2005/0121688 A1 | 6/2005 | Nagai et al. |
| 2005/0133810 A1 | 6/2005 | Roberts et al. |
| 2005/0140291 A1 | 6/2005 | Hirakata et al. |
| 2005/0145865 A1 | 7/2005 | Okuyama et al. |
| 2005/0156510 A1 | 7/2005 | Chua et al. |
| 2005/0184300 A1 | 8/2005 | Tazima |
| 2005/0189551 A1 | 9/2005 | Peng |
| 2005/0194598 A1 | 9/2005 | Kim et al. |
| 2005/0196887 A1 | 9/2005 | Liu |
| 2005/0205884 A1 | 9/2005 | Kim et al. |
| 2005/0207152 A1 | 9/2005 | Maxik |
| 2005/0211997 A1 | 9/2005 | Suehiro et al. |
| 2005/0212002 A1 | 9/2005 | Sanga et al. |
| 2005/0218790 A1 | 10/2005 | Blumel |
| 2005/0224830 A1 | 10/2005 | Blonder et al. |
| 2005/0237005 A1 | 10/2005 | Maxik |
| 2005/0242734 A1 | 11/2005 | Maxik |
| 2005/0243570 A1 | 11/2005 | Chaves et al. |
| 2005/0248271 A1 | 11/2005 | Ng |
| 2005/0253157 A1 | 11/2005 | Ohashi |
| 2005/0253158 A1 | 11/2005 | Yasukawa |
| 2005/0265404 A1 | 12/2005 | Ashdown |
| 2006/0000964 A1 | 1/2006 | Ye |
| 2006/0001036 A1 | 1/2006 | Jacob et al. |
| 2006/0001186 A1 | 1/2006 | Richardson |
| 2006/0006408 A1 | 1/2006 | Suehiro et al. |
| 2006/0008941 A1 | 1/2006 | Haskell et al. |
| 2006/0009006 A1 | 1/2006 | Murai |
| 2006/0012299 A1 | 1/2006 | Suehiro et al. |
| 2006/0017055 A1 | 1/2006 | Cropper et al. |
| 2006/0038187 A1 | 2/2006 | Ueno |
| 2006/0063028 A1 | 2/2006 | Leurs et al. |
| 2006/0043399 A1 | 3/2006 | Miyagaki et al. |
| 2006/0054905 A1 | 3/2006 | Schwach et al. |
| 2006/0082295 A1 | 4/2006 | Chin |
| 2006/0091376 A1 | 5/2006 | Kim et al. |
| 2006/0097631 A1 | 5/2006 | Lee |
| 2006/0118805 A1 | 6/2006 | Camras et al. |
| 2006/0125385 A1 | 6/2006 | Lu et al. |
| 2006/0138439 A1 | 6/2006 | Bogner et al. |
| 2006/0145170 A1 | 7/2006 | Cho |
| 2006/0154392 A1 | 7/2006 | Tran et al. |
| 2006/0163586 A1 | 7/2006 | Denbaars et al. |
| 2006/0163601 A1 | 7/2006 | Harle et al. |
| 2006/0164836 A1 | 7/2006 | Suehiro et al. |
| 2006/0171152 A1 | 8/2006 | Suehiro et al. |
| 2006/0175624 A1 | 8/2006 | Sharma et al. |
| 2006/0186418 A1 | 8/2006 | Edmond et al. |
| 2006/0186424 A1 | 8/2006 | Fujimoto et al. |
| 2006/0189026 A1 | 8/2006 | Cropper et al. |
| 2006/0192217 A1 | 8/2006 | David |
| 2006/0193130 A1 | 8/2006 | Ishibashi |
| 2006/0194359 A1 | 8/2006 | Weisbuch |
| 2006/0194363 A1 | 8/2006 | Giesberg |
| 2006/0202219 A1 | 9/2006 | Ohashi et al. |
| 2006/0202226 A1 | 9/2006 | Weisbuch et al. |
| 2006/0234486 A1 | 10/2006 | Speck |
| 2006/0237723 A1 | 10/2006 | Ito |
| 2006/0237732 A1 | 10/2006 | Nagai et al. |
| 2006/0239006 A1 | 10/2006 | Chaves et al. |
| 2006/0243993 A1 | 11/2006 | Yu |
| 2006/0246722 A1 | 11/2006 | Speck |
| 2006/0261364 A1 | 11/2006 | Suehiro |
| 2006/0267026 A1 | 11/2006 | Kim et al. |
| 2006/0273336 A1 | 12/2006 | Fujikura et al. |
| 2006/0273343 A1 | 12/2006 | Nakahata |
| 2006/0284195 A1 | 12/2006 | Nagai |
| 2006/0289892 A1 | 12/2006 | Lee et al. |
| 2006/0292747 A1 | 12/2006 | Loh |
| 2007/0001185 A1 | 1/2007 | Lu |
| 2007/0001186 A1 | 1/2007 | Murai et al. |
| 2007/0012940 A1 | 1/2007 | Suh et al. |
| 2007/0019409 A1 | 1/2007 | Nawashiro |
| 2007/0029560 A1 | 2/2007 | Su |
| 2007/0065960 A1 | 3/2007 | Fukshima et al. |
| 2007/0085075 A1 | 4/2007 | Yamazaki et al. |
| 2007/0085100 A1 | 4/2007 | Diana et al. |
| 2007/0102721 A1 | 5/2007 | Denbaars et al. |
| 2007/0120135 A1 | 5/2007 | Soules et al. |
| 2007/0125995 A1 | 6/2007 | Weisbuch |
| 2007/0139949 A1 | 6/2007 | Tanda |
| 2007/0145397 A1 | 6/2007 | Denbaars et al. |
| 2007/0147072 A1 | 6/2007 | Scobbo |
| 2007/0182297 A1 | 8/2007 | Drazic et al. |
| 2007/0189013 A1 | 8/2007 | Ford |
| 2007/0252164 A1 | 11/2007 | Zhong |
| 2007/0267976 A1 | 11/2007 | Bohler |
| 2007/0290224 A1 | 12/2007 | Ogawa |
| 2008/0017870 A1 | 1/2008 | Diamantidis |
| 2008/0030691 A1 | 2/2008 | Godo |
| 2008/0111146 A1 | 5/2008 | Nakamura et al. |
| 2008/0121918 A1 | 5/2008 | DenBaars et al. |
| 2008/0128730 A1 | 6/2008 | Fellows |
| 2008/0128731 A1 | 6/2008 | DenBaars |
| 2008/0135864 A1 | 6/2008 | David |
| 2008/0137360 A1 | 6/2008 | Van Jijswick |
| 2008/0149949 A1 | 6/2008 | Nakamura |

(56) References Cited

U.S. PATENT DOCUMENTS

| | | | |
|---|---|---|---|
| 2008/0149959 A1 | 6/2008 | Nakamura | |
| 2008/0169752 A1 | 7/2008 | Hattori | |
| 2008/0173890 A1 | 7/2008 | Sung | |
| 2008/0182420 A1 | 7/2008 | Hu | |
| 2008/0191191 A1 | 8/2008 | Kim | |
| 2008/0191224 A1 | 8/2008 | Emerson | |
| 2009/0078951 A1 | 3/2009 | Miki | |
| 2009/0114928 A1 | 5/2009 | Messere et al. | |
| 2009/0121250 A1 | 5/2009 | DenBaars | |
| 2009/0140630 A1 | 6/2009 | Kijima | |
| 2009/0146170 A1 | 6/2009 | Zhong | |
| 2009/0315055 A1 | 12/2009 | Tamboli | |
| 2010/0059787 A1 | 3/2010 | Hoshina | |
| 2010/0090240 A1 | 4/2010 | Tamboli | |
| 2010/0283078 A1 | 11/2010 | DenBaars | |
| 2010/0289043 A1 | 11/2010 | Aurelien | |
| 2011/0050073 A1* | 3/2011 | Huang | F21K 9/00 |
| | | | 313/317 |
| 2011/0079806 A1 | 4/2011 | Hsu | |
| 2011/0089455 A1 | 4/2011 | Diana | |
| 2011/0193061 A1 | 8/2011 | Hsu | |
| 2012/0043568 A1 | 2/2012 | Yan | |
| 2012/0146503 A1* | 6/2012 | Negley | F21K 9/62 |
| | | | 313/46 |
| 2012/0161180 A1 | 6/2012 | Komatsu | |
| 2014/0022788 A1* | 1/2014 | Dan | F21V 3/02 |
| | | | 362/249.02 |
| 2014/0252396 A1 | 9/2014 | Fujii | |
| 2014/0292618 A1 | 10/2014 | Yamazaki | |
| 2015/0102378 A1 | 4/2015 | Huang | |
| 2015/0270444 A1 | 9/2015 | Liu | |
| 2016/0238201 A1* | 8/2016 | Ray | H05K 1/16 |
| 2016/0351619 A1* | 12/2016 | Cramer | H04M 1/185 |
| 2016/0377237 A1* | 12/2016 | Zhang | F21K 9/232 |
| | | | 362/311.02 |
| 2017/0018049 A1* | 1/2017 | Ray | G06Q 90/00 |
| 2018/0190888 A1 | 7/2018 | Kim | |
| 2019/0045593 A1* | 2/2019 | Miskin | H05B 45/39 |
| 2019/0293242 A1* | 9/2019 | Park | H01L 33/504 |
| 2020/0200337 A1* | 6/2020 | Hikmet | H05K 1/0274 |
| 2020/0209658 A1* | 7/2020 | Xiao | G02F 1/133603 |

FOREIGN PATENT DOCUMENTS

| | | |
|---|---|---|
| AU | 2010257325 | 1/2011 |
| CA | 3013021 A1 | 8/2019 |
| CN | 2831445 | 10/2006 |
| DE | 19807758 | 12/1998 |
| DE | 10245932 | 2/2004 |
| DE | 102004040518 | 5/2005 |
| DE | 10361801 | 8/2005 |
| DE | 102004028143 | 12/2006 |
| DE | 112007000313 | 7/2009 |
| DE | 102017105918 * | 3/2017 |
| DE | 102017105918 A1 * | 9/2018 |
| DE | 102017105918 A1 | 9/2018 |
| EP | 1081771 | 3/2001 |
| EP | 1116419 | 7/2001 |
| EP | 1207563 | 5/2002 |
| EP | 1213773 | 6/2002 |
| EP | 1225643 | 7/2002 |
| EP | 1416543 | 5/2004 |
| EP | 1429395 | 6/2004 |
| EP | 1536487 | 6/2005 |
| EP | 1843402 A1 | 10/2007 |
| EP | 1876385 | 1/2008 |
| EP | 2711399 A1 | 3/2014 |
| EP | 1603170 | 8/2018 |
| EP | 3682158 A1 | 7/2020 |
| ES | 2338925 | 5/2010 |
| FR | 2858859 | 2/2005 |
| GB | 2371679 | 7/2002 |
| GB | 2413698 | 11/2005 |
| GP | 2345954 | 7/2000 |
| JP | S5324300 | 3/1978 |
| JP | H0210395 | 1/1990 |
| JP | H08298345 | 11/1996 |
| JP | H096260 | 1/1997 |
| JP | H0927642 | 1/1997 |
| JP | H0955540 | 2/1997 |
| JP | H10032351 | 2/1998 |
| JP | 10200165 | 7/1998 |
| JP | H10200165 | 7/1998 |
| JP | H1117223 | 1/1999 |
| JP | H1146019 | 2/1999 |
| JP | H11186590 | 7/1999 |
| JP | 2000-277808 | 10/2000 |
| JP | 2001-024223 | 1/2001 |
| JP | 2001-044516 | 2/2001 |
| JP | 3075689 | 2/2001 |
| JP | 2001-068731 | 3/2001 |
| JP | 2001-111112 | 4/2001 |
| JP | 2001-126515 | 5/2001 |
| JP | 2001-160629 | 6/2001 |
| JP | 2001-194232 | 7/2001 |
| JP | 3219000 | 10/2001 |
| JP | 2002-008735 | 1/2002 |
| JP | 2002-084002 | 3/2002 |
| JP | 2002-124589 | 4/2002 |
| JP | 2002-185045 | 6/2002 |
| JP | 2002-203991 | 7/2002 |
| JP | 2002-208735 | 7/2002 |
| JP | 2002-232020 | 8/2002 |
| JP | 2002-280614 | 9/2002 |
| JP | 2002-289925 | 10/2002 |
| JP | 2002-314152 A | 10/2002 |
| JP | 2003-011417 | 1/2003 |
| JP | 2003-016808 | 1/2003 |
| JP | 2003-069085 | 3/2003 |
| JP | 2003-163090 | 6/2003 |
| JP | 2003-249692 | 9/2003 |
| JP | 2003-318441 | 11/2003 |
| JP | 2003-347586 | 12/2003 |
| JP | 2004-111981 | 4/2004 |
| JP | 2004-158557 | 6/2004 |
| JP | 2004-253743 | 9/2004 |
| JP | 2004-296575 | 10/2004 |
| JP | 2004-296999 | 10/2004 |
| JP | 2004-311677 | 11/2004 |
| JP | 2005-035864 | 2/2005 |
| JP | 2005-057310 | 3/2005 |
| JP | 2005-086051 | 3/2005 |
| JP | 2005-093102 | 4/2005 |
| JP | 2005-109289 | 4/2005 |
| JP | 2005-150261 | 6/2005 |
| JP | 2005-183900 | 7/2005 |
| JP | 2005-191197 | 7/2005 |
| JP | 2005-191514 | 7/2005 |
| JP | 2005-267926 | 9/2005 |
| JP | 2005-268323 | 9/2005 |
| JP | 2005-326757 | 11/2005 |
| JP | 2005-347677 | 12/2005 |
| JP | 2005-353816 | 12/2005 |
| JP | 2006-024615 | 1/2006 |
| JP | 2006-032387 | 2/2006 |
| JP | 2006-041479 | 2/2006 |
| JP | 2006-060034 | 3/2006 |
| JP | 2006-128227 | 5/2006 |
| JP | 2006-156590 | 6/2006 |
| JP | 2006-165326 | 6/2006 |
| JP | 2006-179718 | 7/2006 |
| JP | 2006-191103 | 7/2006 |
| JP | 2006-210824 | 8/2006 |
| JP | 2006-229259 | 8/2006 |
| JP | 2006-237264 | 9/2006 |
| JP | 2006-245066 | 9/2006 |
| JP | 2006-253298 | 9/2006 |
| JP | 2006-261688 | 9/2006 |
| JP | 2006-278924 | 10/2006 |
| JP | 2006-287113 | 10/2006 |
| JP | 2006-294907 | 10/2006 |
| JP | 2006-278751 | 11/2006 |
| JP | 2006-303258 | 11/2006 |

(56) References Cited

FOREIGN PATENT DOCUMENTS

| | | |
|---|---|---|
| JP | 2007-165811 | 6/2007 |
| JP | 3970800 | 9/2007 |
| JP | 2007-311626 | 11/2007 |
| JP | 2007-324220 | 12/2007 |
| JP | 2007-324326 | 12/2007 |
| JP | 4076329 | 4/2008 |
| KR | 20020097420 | 12/2002 |
| KR | 100715580 | 9/2003 |
| KR | 200403690 | 12/2005 |
| KR | 100563372 | 3/2006 |
| KR | 100618941 | 9/2006 |
| KR | 100619441 | 9/2006 |
| KR | 100626365 | 9/2006 |
| KR | 100643582 | 11/2006 |
| KR | 100733903 | 7/2007 |
| KR | 100786798 | 12/2007 |
| KR | 100796670 | 1/2008 |
| KR | 100808705 | 2/2008 |
| KR | 100828174 | 5/2008 |
| KR | 100840637 | 6/2008 |
| KR | 101147342 | 5/2012 |
| SG | 100618 | 12/2003 |
| TW | 586096 | 5/2004 |
| WO | WO 2001/047037 | 6/2001 |
| WO | WO 2002/090825 | 11/2002 |
| WO | WO 2005/064666 | 7/2005 |
| WO | WO 2005/066946 | 7/2005 |
| WO | WO 2005/083037 | 9/2005 |
| WO | WO 2005/124879 | 12/2005 |
| WO | WO 2006/009854 | 1/2006 |
| WO | WO 2006/098545 | 9/2006 |
| WO | WO 2006/105644 | 10/2006 |
| WO | WO 2006/131087 | 12/2006 |
| WO | WO 2007/055455 | 5/2007 |
| WO | WO2019/048345 A1 * | 8/2018 |
| WO | WO2020088966 A1 * | 10/2019 |
| WO | WO 2020/002144 A1 | 1/2020 |
| WO | WO 2020/088966 A1 | 5/2020 |
| WO | WO-2020088966 A1 * | 5/2020 ............. F21K 9/232 |

OTHER PUBLICATIONS

Atex LED How to contact us. (available at least as early as Feb. 6, 2004 at http://www.atexled.com/contact.html), p. 1, retrieved from the Internet at The Wayback Machine <https://web.archive.org/web/20040206210502/http://www.atexled.com/contact.html> on Jun. 3, 2021.

Atex LED Source Light Gallery. (available at least as early as Feb. 28, 2004 at http://www.atexled.com/gallery_source_02.html), 1 page, retrieved from the Internet at The Wayback Machine <https://web.archive.org/web/20040228040544/http://www.atexled.com/gallery_source_02.html> on Jun. 3, 2021.

Bergh, A.A., et al., (1976), "Light-Emitting Diodes", pp. 472, 510-11, and 562-563, Clarendon Press, UK.

Blackwell, Glenn R. (editor). (2000). The Electronic Packaging Handbook, 1 page, CRC Press, US.

Buffalo Courier (Aug. 29, 1909) General Electric Tungsten Lamps. Buffalo Courier, Aug. 29, 1909, pp. 1, 13, 29, retrieved from the Internet at Newspapers.com by Ancestry at <https://www.newspapers.com/image/370380744> on Dec. 16, 2020.

Bulović, V., et al. "Transparent Light-Emitting Devices", Nature, Mar. 7, 1996, p. 29, vol. 380, Nature Research, UK.

Chen, B. J., et al., "Transparent Organic Light-Emitting Devices with LiF/Mg: Ag Cathode", Optics Express, Feb. 7, 2005, pp. 937-941, vol. 13, Optical Society of America, US.

Cheng, Jiping, et al., Development of Translucent Aluminum Nitride (AlN) Using Microwave Sintering Process, Journal of Electroceramics, Oct. 1, 2002, pp. 67-71, vol. 9, No. 1, Kluwer Academic Publishers, Netherlands.

Chua, C.L., et al., "Dielectrically-bonded long wavelength vertical cavity laser on GaAs substrates using strain-compensated multiple quantum wells", IEEE Photonics Technology Letters, Dec. 1994, vol. 6, Issue 12, pp. 1400-1402, IEEE, US.

Craford, M. G., "LEDs Challenge the Incandescents", IEEE Circuits and Devices Magazine, Sep. 1992, vol. 8, Issue 5, pp. 24-29, IEEE, US.

Cuong, T. V., et al., "Calculation of the External Quantum Efficiency of Light Emitting Diodes with Different Chip Designs", Phys. Stat. Sol., Sep. 7, 2004, pp. 2433-2437, (c) 1, No. 10, Wiley-VCH Verlag GmbH & Co. KGaA, Germany.

Drybred, John, "Fulton renovation has modern feel but keeps Victorian look", Intelligencer Journal, Oct. 3, 1995, pp. 1-3, vol. 16, LNP Media Group Inc., US.

Forrest, Stephen, et al. (Feb. 2004). Investigations of Operational Lifetime and Modes of Failure of Organic Light Emitting Devices. United States Air Force Research Laboratory, AFRL-HE-WP-TR-2003-0154, 87 pages, U.S. Government Publishing Office, US.

Fralic, Shelley, "Rejuvenation", The Vancouver Sun, Aug. 18, 2006, pp. 1-5, Postmedia Network Inc., Canada.

Freudenrich, Craig, "How OLEDs Work", Mar. 24, 2005, retrieved from the Internet at <https://electronics.howstuffworks.com/oled.htm> on Jul. 14, 2005, 7 pages.

Fujii, T., et al., "Increase in the extraction efficiency of GaN-based light-emitting diodes via surface roughening", Appl. Phys. Lett., Feb. 9, 2004, pp. 855-857, vol. 84, No. 6, American Institute of Physics, US.

Gordon, Roy G., et al., "Chemical vapor deposition of aluminum nitride thin films", Journal of Materials Research, Jul. 1992, pp. 1679-1684, vol. 7, No. 7, Materials Research Society, US.

Graf, Rudolf F. (1999) Modern Dictionary of Electronics 7th Edition, pp. 270, 417-420, 422, 486, 677-678, 686, 745, 799, Newnes, Australia.

Greig, William. (2007). Integrated Circuit Packaging, Assembly and Interconnections, pp. 276-277, Springer, Germany.

Gu, G., et al., "Transparent Organic Light Emitting Devices", Applied Physics Letters, May 6, 1996, vol. 68, No. 19, pp. 2606-2608, American Institute of Physics, US.

Gu, G., et al., "Transparent Stacked Organic Light Emitting Devices. II. Device Performance and Applications to Displays", Journal of Applied Physics, Oct. 15, 1999, pp. 4076-4084, vol. 86, No. 8, American Institute of Physics, US.

Han, Dae-Seob, et al., "Improvement of Light Extraction Efficiency of Flip-Chip Light-Emitting Diode by Texturing the Bottom Side Surface of Sapphire Substrate", IEEE Photonics Technology Letters, Jul. 1, 2006, pp. 1406-1408, vol. 18, No. 13, IEEE, US.

Hoefler, G. E., et al., "Wafer bonding of 50-mm diameter GaP to AlGaInP-GaP light-emitting diode wafers", Appl. Phys. Lett. Aug. 5, 1996, pp. 803-805, vol. 69, American Institute of Physics, US.

Interrante, Leonard V., et al., "Studies of organometallic precursors to aluminum nitride", Mat. Res. Soc. Symp. Proc., Apr. 15-19, 1986, vol. 73., pp. 359-366, Materials Research Society, U.S.

Jasinski, J., et al., "Microstructure of GaAs/GaN interfaces produced by direct wafer fusion", Applied Physics Letters, Oct. 21, 2002, pp. 3152-3154, vol. 81, No. 17, American Institute of Physics, US.

Johnson, Colin R. (Jan. 12, 2003) Sandia: Output/wavelength firsts for deep-UV LEDs, EE/Times, retrieved from the Internet at <https://www.eetimes.com/sandia-output-wavelength-firsts-for-deep-uv-leds/#> on Sep. 9, 2019, 3 pages.

Kish, F. A., et al., "Very high-efficiency semiconductor wafer-bonded transparent substrate $(Al_xGa_{1-x})_{0.5}In_{0.5}P$/GaP light-emitting diodes", Appl. Phys. Lett., May 12, 1994, pp. 2839-2841, vol. 64, American Institute of Physics, U.S.

Kish, F. A., et al., "Low-resistance Ohmic conduction across compound semiconductor wafer-bonded interfaces" Appl. Phys. Lett., Oct. 2, 1995, pp. 2060-2062, vol. 67, American Institute of Physics, US.

Klages, Klages, "A Trick of the light: Designers share easy lighting tips to transform a room, and a mood", Calgary Herald, Jan. 6, 2001, pp. 1-5, Postmedia Network Inc. Canada.

Kuo, H.C., et al., (Oct. 29-Nov. 3, 2006), "Improvement in the Extraction Efficiency of AlGaInP and GaN Thin Film LEDs Via N-Side Surface Roughing", 210th ECS Meeting, Abstract #1548, 2 pages, vol. 3, The Electrochemical Society, US.

(56) References Cited

OTHER PUBLICATIONS

Kuramoto, Nobuyuki, et al., "Translucent AlN ceramic substrate", IEEE Transactions on Components, Hybrids, and Manufacturing Technology, Dec. 1986, pp. 386-390, vol. CHMT-9, No. 4, IEEE, US.

Laplante, Phillip A. (1999) Comprehensive Dictionary of Electrical Engineering, 1999, 32 pages excerpt, including Prefaces, Forward, Editors, 6, 18, 62, 86, 213, 362, 364, and 584, CRC Press LLC, US.

Lee, Chan, J., et al., "Cavity effect of transparent organic emitting device using metal cathode", Proceedings of SPIE, Sep. 8, 2004, pp. 306-313, vol. 5464, Strasbourg, France.

Lee, Song J., "Analysis of InGaN High-Brightness Light-Emitting Diodes", Japanese Journal of Applied Physics, Nov. 1998, pp. 5990-5993, vol. 37, Issue 11, The Japan Society of Applied Physics, Japan.

Liau, Z.L. et al., "Wafer fusion: A novel technique for optoelectronic device fabrication and monolithic integration", Appl. Phys. Lett., Feb. 19, 1990, pp. 737-739, vol. 56, No. 8, American Institute of Physics, US.

Murai, Akihiko, et al., "Hexagonal pyramid shaped light-emitting diodes based on ZnO and GaN direct wafer bonding" Applied Physics Letters, Oct. 26, 2006, pp. 171116-1-171116-3, vol. 89, No. 17, American Institute of Physics, US.

Murai, Akihiko, et al., "Wafer Bonding of GaN and ZnSSe for Optoelectronic Applications", Jpn. J. Appl. Phys., Sep. 10, 2004, pp. L1275-L1277, vol. 43, No. 10A, The Japan Society of Applied Physics, Japan.

Nakahara, K. et al., "Improved External Efficiency InGaN-Based Light-Emitting Diodes with Transparent Conductive Ga-Doped ZnO as p-Electrodes", Jpn. J. Appl. Phys., Jan. 9, 2004, pp. L180-L182, vol. 43, No. 2A, The Japan Society of Applied Physics, Japan.

Nakamura, Shuji, et al., "High-Brightness InGaN Blue, Green and Yellow Light-Emitting Diodes with Quantum Well Structures", Jpn. J. Appl. Phys., Jul. 1, 1995, pp. L797-L799, vol. 34, Part 2, No. 7A, The Japan Society of Applied Physics, Japan.

Narukawa, Y. et al., "Ultra-High Efficiency White Light Emitting Diodes", Jpn. J. Appl. Phys., Oct. 13, 2006, pp. L1084-L1086, vol. 45, No. 41, The Japan Society of Applied Physics, Japan.

Noctron seeks Chinese partners to make innovative LED products (Aug. 31, 2006)—News—LEDs Magazine (available at least as early as Oct. 17, 2006 as contemporaneously archived by http://web.archive.org/web/20061017131530/http://ledsmagazine.com/articles/news/3/8/23/1) retrieved on Nov. 1, 2019, 2 pages.

Orita, Kenji, et al., "High-Extraction-Efficiency Blue Light-Emitting Diode Using Extended-Pitch Photonic Crystal", Jpn. J. Appl. Phys., Aug. 25, 2004, pp. 5809-5813, vol. 43, No. 8B, The Japan Society of Applied Physics, Japan.

Parthasarathy, G., et al., "A Metal-Free Cathode for Organic Semiconductor Devices", Applied Physics Letters, Apr. 27, 1998, pp. 2138-2140, vol. 72, No. 17, American Institute of Physics, US.

Parthasarathy, Gautam, et al., "A Full-Color Transparent Metal-Free Stacked Organic Light Emitting Device with Simplified Pixel Biasing", Advanced Materials, Aug. 1999, vol. 11, No. 11, pp. 907-910, Wiley-VCH Verlag GmbH & Co. KGaA, Germany.

Peng, Wei Chih, et al., "Enhance the Luminance Intensity of InGaN-GaN Light-Emitting Diode by Roughening both the p-GaN Surface and the Undoped-GaN Surface Using Wafer Bonding Methods", ECS Transactions, Jul. 26, 2006, vol. 3, No. 6, pp. 335-338, The Electrochemical Society, US.

Peng, Wei Chih, et al., "Improved Luminance Intensity of InGaN-GaN Light-Emitting Diode by Roughening both the p-GaN Surface and the Undoped-GaN Surface", Applied Physics Letters, Jul. 26, 2006, pp. 041116-1-041116-3, vol. 89, American Institute of Physics, US.

Peng, Wei Chih, et al. "Enhanced Light Output in Double Roughened GaN Light-Emitting Diodes via Various Texturing Treatments of Undoped-GaN Layer", Japanese Journal of Applied Physics, Oct. 6, 2006, pp. 7709-7712, vol. 45, No. 10A, The Japan Society of Applied Physics, Japan.

Schubert, E. Fred (2003), Light-Emitting Diodes, First Edition, p. 149, Cambridge University Press, UK.

Schubert, E. Fred (2006). Light Emitting Diodes. Second Edition, 8 select pages, Cambridge University Press, UK.

Schubert, E. Fred (Feb. 2018) Light Emitting Diodes, Third Edition, pp. 3-1-3-20, E. Fred Schubert, US.

Stringfellow, G.B. and M.G. Crawford (Eds.). (Oct. 1997) High-brightness light-emitting diodes. In: R.K. Willardson and E.R. Weber (Series Eds.), Semiconductors and Semimetals, pp. 176-177, 338-339, vol. 48. New York: Academic Press, US.

Tadatomo, K., et al., "High Output Power loGaN Ultraviolet Light-Emitting Diodes Fabricated on Patterned Substrates Using Metalorganic Vapor Phase Epitaxy", physica status solidi (a), Nov. 22, 2001, pp. 121-125, vol. 188, No. 1, Wiley-VCH Verlag Gmbh & Co. KGaA, Germany.

Tadatomo, K. et al., "High-output power near-ultraviolet and violet light-emitting diodes fabricated on patterned sapphire substrates using metalorganic vapor phase epitaxy", in Third International Conference on Solid State Lighting, Proceedings of SPIE, Jan. 26, 2004, pp. 243-249, vol. 5187, SPIE, US.

Tektite—Marker Lights, Lite Fire Fly products 2003 or earlier U.S., retrieved from the Internet at The Wayback Machine <https://web.archive.org/web/20001015073040/http://tek-tite.com/Marker_Lights/marker_lights.html and https://web.archive.org/web/20011024184816/http://tek-tite.com/Marker_Lights/marker_lights.html> on Jan. 8, 2021, 7 pages.

Tummala, Rao, R., et al., (1989). Microelectronics Packaging Handbook, pp. 548-553 and 1143, Van Nostrand Reinhold, US.

Wu, Chung-Chih, et al,. "Advanced Organic Light-Emitting Devices for Enhancing Display Performances", Journal of Display Technology, Dec. 2005, pp. 248-266, vol. 1, No. 2, IEEE, US.

Yamada, Motokazu, et al., "InGaN-Based Near-Ultraviolet and Blue-Light-Emitting Diodes with High External Quantum Efficiency Using a Patterned Sapphire Substrate and a Mesh Electrode", Jpn. J. Appl. Phys., Dec. 15, 2002, pp. L1431-L1433, Part 2, vol. 12B, The Japan Society of Applied Physics, Japan.

Zhu, Furong, et al., "Toward Novel Flexible Display—Top-Emitting OLEDs on Al-Laminated PET Substrates", Proceedings of the IEEE, Aug. 8, 2005, pp. 1440-1446, vol. 93, No. 8, IEEE, US.

Zŭkauskas, Arturas, et al., "Chapter 1: A Historical Introduction", *Introduction to Solid-State Lighting*, Apr. 18, 2002, 14 pages, John Whiley & Sons, Inc., US.

Cozzan, Clayton, "Monolithic translucent $BaMgAl_{10}O_{17}:Eu^{2+}$ phosphors for laser-driven solid state lighting", AIP Advances, Oct. 11, 2016, pp. 105005-1 to 105005-6, vol. 6, AIP Publishing, US.

Cozzan, Clayton, "Stable, Heat Conducting Phosphor Composites for High-Power Laser Lighting", ACS Applied Materials & Interfaces, Feb. 2018, 34 pages, American Chemical Society, US.

Pankove, Jacques I. and Theodore D. Moustakas (Eds.). (Oct. 1999) Gallium Nitride (GaN) II. In: R.K. Willardson and E.R. Weber (Series Eds.), Semiconductors and Semimetals, p. 339, vol. 57, Academic Press, US.

Laplante, Phillip A. (2000) Electrical Engineering Dictionary CRCnetBASE, 2000, excerpt 3 pages, CRC Press LLC, US.

The American Heritage College Dictionary, Fourth Edition, 2002, pp. 91, 459, 494, 550, 790, 909, 974, 1260, 1274, 1275, 1377, and 1461, Houghton Mifflin Company, U.S.

The American Heritage Science Dictionary, First Edition, 2005, excerpt 7 pages, Houghton Mifflin Company, U.S.

Cambridge Dictionary of American English, 2000, pp. 48, 279, 301, 342, 343, 557, 594, 785, 786, and 928, Cambridge University Press, UK.

Lee, Stuart M. (Editor), "Dictionary of Composite Materials Technology", 1989, pp. 62, 29, 138, and 147, Technomic Publishing Company, US.

Millodot, Michel, "Dictionary of Optometry and Visual Science", Seventh Edition, Aug. 25, 2009, pp. 37, 191, 192, 204, 206, 231, 332, 351, and 389, Elsevier Limited, UK.

Merriam-Webster's Collegiate Dictionary, Tenth Edition, 2000, pp. 74, 377, 412, 462, 662, 758, 759, 811, 1060, 1073, 1171, 1250, and 1251, Merriam-Webster, Incorporated, US.

(56) References Cited

OTHER PUBLICATIONS

Jewell, Elizabeth, et al. (Editors), "The New Oxford American Dictionary", 2001, pp. 102, 557, 671, 971, 1115, 1198, 1550, 1549, 1567, 1696, 1799, and 1800, Oxford University Press, US.
Soanes, Catherine, et al. (Editors), "Oxford Dictionary of English", Second Edition, 2003, pp. 100, 101, 568, 613, 685, 998, 1147, 1231, 1605, 1606, 1623, 1762, and 1875, Oxford University Press, UK.
Oxford Dictionary of Science, Sixth Edition, 2010, p. 834, Oxford University Press, UK.
The Oxford English Dictionary, Second Edition, vol. XVIII, 1989, pp. 419-420, Oxford University Press, UK.
Random House Unabridged Dictionary, Second Edition, 1993, p. 2012, Random House, Inc., US.
Random House Webster's College Dictionary, Second Edition, 1997, pp. 85, 427, 462, 515, 748, 857, 914, 1176, 1188, 1285, 1367, and 1368, Random House, Inc., US.
Shorter Oxford English Dictionary, Sixth Edition, 2007, pp. 3326, Oxford University Press, US.
Gove, Babcock Philip (Editor), "Webster's Third New International Dictionary of the English Language Unabridged", 2002, excerpt of 17 pages, Merriam-Webster Inc., US.
Wikipedia Contributors, "LED Filament", Wikipedia: The Free Encyclopedia, last edited on Jul. 13, 2020, 4 pages, retrieved from https://en.wikipedia.org/wiki/LED_filament on Aug. 7, 2020.
Wikipedia Contributors, "Flexible Circuit", Wikipedia: The Free Encyclopedia, last edited on Mar. 11, 2020, 3 pages, retrieved from https://en.wikipedia.org/wiki/Flexible_circuit on Aug. 7, 2020.
International Searching Authority, International Search Report and Written Opinion received for International Application No. PCT/US2021/043701, dated Oct. 20, 2021, 13 pages, European Patent Office, Netherlands.

\* cited by examiner

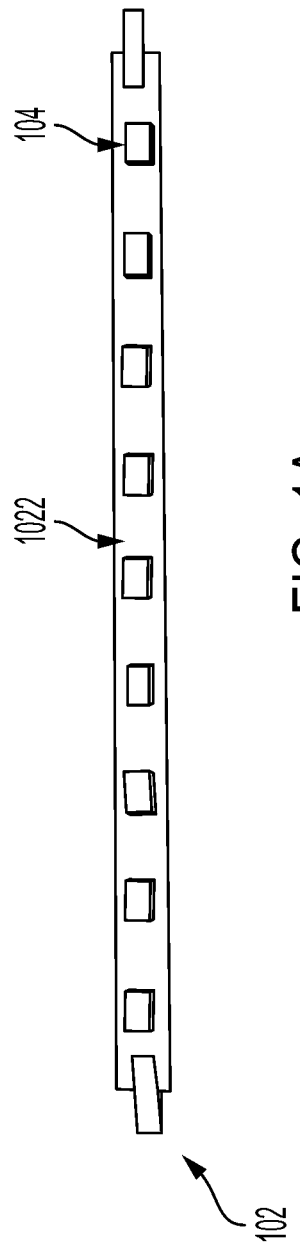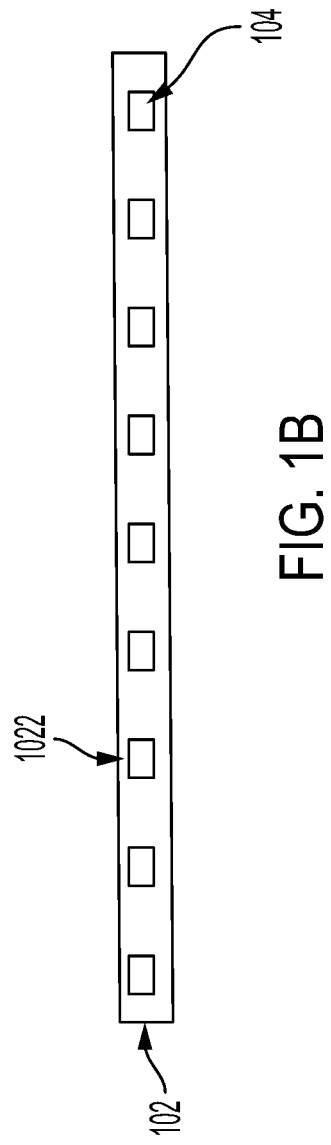

OMNIDIRECTIONAL FLEXIBLE LIGHT EMITTING DEVICE

BACKGROUND

Light emitting devices may comprise light emitting diodes. Light emitting diodes (also referred to herein as LEDs) are semiconductor devices that emit light when an electric current is passed through them. The light is produced when particles that carry the electric current (e.g., electrons and holes) combine together with the semiconductor material of the semiconductor devices. LEDs are described as solid-state devices, which distinguishes them from other lighting technologies that use heated filaments or gas discharge as lighting sources (e.g., incandescent, tungsten halogen lamps; fluorescent lamps).

LEDs are widely used in lighting applications for residential and commercial structures. Light bulbs utilizing LEDs are far more efficient when compared to traditional lighting such as incandescent and fluorescent lights. Most of the energy in LEDs is converted into light and a minimal amount results in heat.

Conventional filament-type lighting devices utilizing LEDs typically have LEDs mounted on one side of the filament. This single-sided configuration of conventional LED filaments provides poor light distribution. To overcome this problem of poor light distribution, conventional solutions have either increased the number of LED filaments mounted in lighting fixtures, and/or employed transparent or translucent filament substrates.

Through applied effort, ingenuity, and innovation many deficiencies of such systems have been solved by developing solutions that are in accordance with the embodiments of the present invention, many examples of which are described in detail herein.

SUMMARY

Various embodiments are directed to a light emitting device configured for providing omnidirectional light output. In certain embodiments, the light emitting device comprises a flexible substrate having a substrate length, a first substrate surface and a second substrate surface. In embodiments, the flexible substrate is configured to be twisted and/or rotated around a longitudinal axis. In embodiments, the light emitting device further comprises a plurality of LED packages disposed on the first substrate surface. The plurality of LED packages of certain embodiments are configured to emit light outward from the flexible substrate.

In embodiments, the flexible substrate may be configured to be permanently flexible. In certain embodiments, the flexible substrate is configured to be twisted and/or rotated within a range of 0° to 90°, 90° to 180°, or 180° to 360°. The flexible substrate of certain embodiments is configured to radiate heat.

In embodiments, the flexible substrate of the light emitting device may further comprise a circuit board. In embodiments, the circuit board comprises a first and second side. In embodiments, the flexible substrate of the light emitting device further comprises a plurality of LED packages disposed on and/or electrically and mechanically couplable to the first side. In embodiments, the flexible substrate of the light emitting device further comprises a plurality of leads/traces disposed on and/or electrically and mechanically couplable to the first or second side of the circuit board and electrically couplable with the plurality of LED packages. In embodiments, the flexible substrate further comprises driver circuitry disposed on and/or electrically and mechanically couplable to the first side or second side of the circuit board. The driver circuitry of certain embodiments is electrically couplable with the plurality of leads/traces of the circuit board.

In certain embodiments, the plurality of LED packages comprise phosphor-based LED packages. Moreover, the flexible substrate of certain embodiments is of a matching color as a phosphor color of the phosphor-based LED packages. In certain embodiments, the plurality of LED packages are configured to emit blue light.

In certain embodiments, the substrate width and at least one LED package width are the same width. In certain embodiments, the flexible substrate comprises polyamide. The substrate width of certain embodiments is 1 to 2 mm, and the substrate length is 5 cm.

Various embodiments directed to a lighting apparatus configured for providing omnidirectional light output are provided. In embodiments, a lighting apparatus may comprise a transparent housing. The transparent housing of certain embodiments may be configurable to house a light emitting device. The transparent housing of certain embodiments may be configurable to protect the integrity of the light emitting device housed within. For example, in various embodiments, the transparent housing may be infused with a gas that is conducive for inhibiting the introduction of moisture and/or other contaminants into the transparent housing. For example, the transparent housing may be infused with dry air or an inert gas to this end.

In embodiments, a lighting apparatus may comprise a base for electrically coupling with a lighting socket. In embodiments, a lighting apparatus may comprise a light emitting device. The light emitting device of certain embodiments is electrically couplable with the base and housed within the transparent housing. The light emitting device of certain embodiments comprises a flexible substrate having a substrate length, a substrate width, a first substrate surface and a second substrate surface. In embodiments, the flexible substrate is configured to be twisted and/or rotated around a longitudinal axis that is parallel to the substrate length. In embodiments, a plurality of LED packages are disposed on the first substrate surface. The LED packages of certain embodiments each comprise an LED package width and are configured to emit light outward from the flexible substrate.

In embodiments, the plurality of LED packages comprise phosphor-based LED packages.

In embodiments, the flexible substrate is of a matching color as a phosphor color of the phosphor-based LED packages.

The substrate width and each LED package width of certain embodiments are the same width.

In embodiments, the base comprises an Edison-type base.
In embodiments, the base comprises a G4-type base.
In embodiments, the base comprises a G6.35-type base.
In embodiments, the base comprises a G6.35-type base.
In embodiments, the base comprises a G9-type base.

The base of certain embodiments is mechanically and/or electrically couplable to the circuit board of the light emitting device of certain embodiments, such that electrical current is provided to the light emitting device.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

BRIEF DESCRIPTION OF THE DRAWINGS

The following Detailed Description, Figures, and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 1A, 1B, and 1C are top views of an exemplary flexible substrate configured in accordance with embodiments of the present disclosure;

DETAILED DESCRIPTION

Figure 1C:
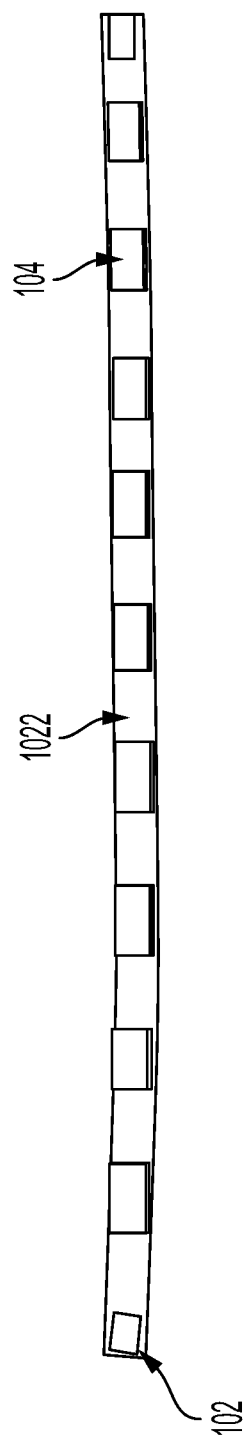

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Lighting emitting devices according to the present disclosure provide greater functionality over conventional lighting devices. Conventional lighting devices employing flexible substrates are typically configured with a first flexible substrate mounted to a second substrate. The second substrate is typically complex in shape. Such a heterogeneous arrangement of substrates contributes to deformation, fracture, delamination, etc., because of the different compositions of the first and second substrates.

Light emitting devices according to the present disclosure may employ a single, twistable substrate. Light emitting devices according to the present disclosure therefore obviate the need for a second substrate, lowering manufacturing costs and providing greater functionality.

Furthermore, a twistable substrate according to the present disclosure may be configured into various shapes as needed. Such adaptability provides greater functionality and light dispersion over conventional designs. For example, a twistable substrate according to the present disclosure may be configured to substantially define a helical shape. The twistable substrate of various embodiments may then, for example, be configured to comprise a plurality of LEDs and suspend between supporting wires, thereby overcoming the deficiencies of conventional LED filament devices.

Conventional devices are typically manufactured so that a flexible substrate accentuates the shape of a standard (e.g., Edison-style) light bulb. Such a conventional design is deficient because it results in a nonoptimal disposition of the LEDs within the light bulb. On the other hand, flexible substrates according to the present disclosure are inherently more geometrically efficient.

The substantially helical configuration of the above example may dispose the LEDs within the light bulb more efficiently. This is because the geometry of a helix ensures that some portion of the light emitted from each LED will maintain a constant angle with the flexible substrate itself. More light from the plurality of LEDs may therefore be emitted outward from the lighting emitting device; less light may be wasted. A flexible substrate according to the present disclosure may be configured in various other regular and irregular shapes. For example, a flexible substrate according to the present disclosure may comprise a spiral or coil shape, while retaining flexibility and geometric efficiency.

Light emitting devices of embodiments according to the present disclosure overcome further light distribution deficiencies of conventional light emitting devices. Conventional lighting devices employing LED filaments are typically configured with LEDs on a single side of the filament. LEDs are "directional" light sources (e.g., LEDs are inherently configured to emit light in a specific and singular direction). Conventional lighting devices therefore produce poor omnidirectional light emission as a result of this single-sided configuration. Employing a twistable/rotatable substrate having LEDs disposed thereon overcomes this directionality deficiency, because the flexible substrate itself is conducive for dictating the direction of light emission. Light emitting devices according to the present disclosure may therefore achieve better, more omnidirectional light emission over conventional lighting devices.

Moreover, conventional lighting devices necessarily employ transparent or translucent filament substrates to compensate for their single-sided configuration. By employing twistable substrates, light emitting devices according to the present disclosure may be configured having opaque or otherwise less than transparent/translucent substrates. Light emitting devices according to embodiments of the present disclosure may therefore provide users with a greater degree of aesthetic choice.

Given the above, it may therefore be desirable to configure a light emitting device according to embodiments of the present disclosure such that two or more flexible substrates are employed. Light emitting devices according to the present disclosure may employ multiple flexible substrates and still achieve improved omnidirectional light emission over conventional lighting devices.

FIGS. 1A, 1B, and 1C are top views of an exemplary flexible substrate 102 configured in accordance with embodiments of the present disclosure. In embodiments, a flexible substrate 102 may comprise a substrate length, a substrate width, a first substrate surface 1022, and a second substrate surface (not shown). In embodiments, the flexible substrate 102 may be configured to be twistably and/or rotatably wrenched about a longitudinal axis that is parallel to the substrate length. The flexible substrate 102 of certain embodiments comprises material conducive for the twisting/rotating of the flexible substrate 102, including but not limited to plastic, polyamide. In embodiments, a plurality of LED packages 104 may be disposed on the first surface 1022 of the flexible substrate 102. The LED packages 104 of certain embodiments may have an LED package width and be configured to emit light outward from the flexible substrate 102. The plurality of LED packages 104 may be electrically connected in series with one another. FIG. 1A illustrates a first LED package width configuration, wherein the LED package width is less than the substrate width. As shown in FIG. 1B, the LED package width of certain embodiments may be equal to or very nearly equal to the substrate width, so that the flexible substrate 102 blocks as little light as possible.

In embodiments, the flexible substrate 102 may be configured to radiate heat. That is, the flexible substrate 102 of certain embodiments may comprise material(s) suitably tolerant of the heat generated by the plurality of LED packages 104. In embodiments, the plurality of LED packages 104 may comprise phosphor-based LED packages. The phosphor-based LED packages 104 of certain embodiments may be configured to emit blue light. Moreover, in embodiments the flexible substrate 102 may be of a matching color as a phosphor color of the phosphor-based LED packages 104 so as to camouflage the flexible substrate 102. The flexible substrate 102 may be configured as opaque or may be less than transparent. The flexible substrate 102 may be configured with metal contact ends for soldering to support wires. The metal contact ends of the flexible substrate 102 may comprise electrical contact pads for mechanical and electrical connection. In embodiments, the flexible substrate 102 may comprise polyamide. In embodiments, the substrate width and each LED package width may be the same width such that the flexible substrate 102 blocks as little light as possible. In embodiments, the substrate width of the flexible substrate 102 may be 1 to 2 millimeters, and the substrate length of the flexible substrate 102 may be 5 centimeters.

Figure 2A:
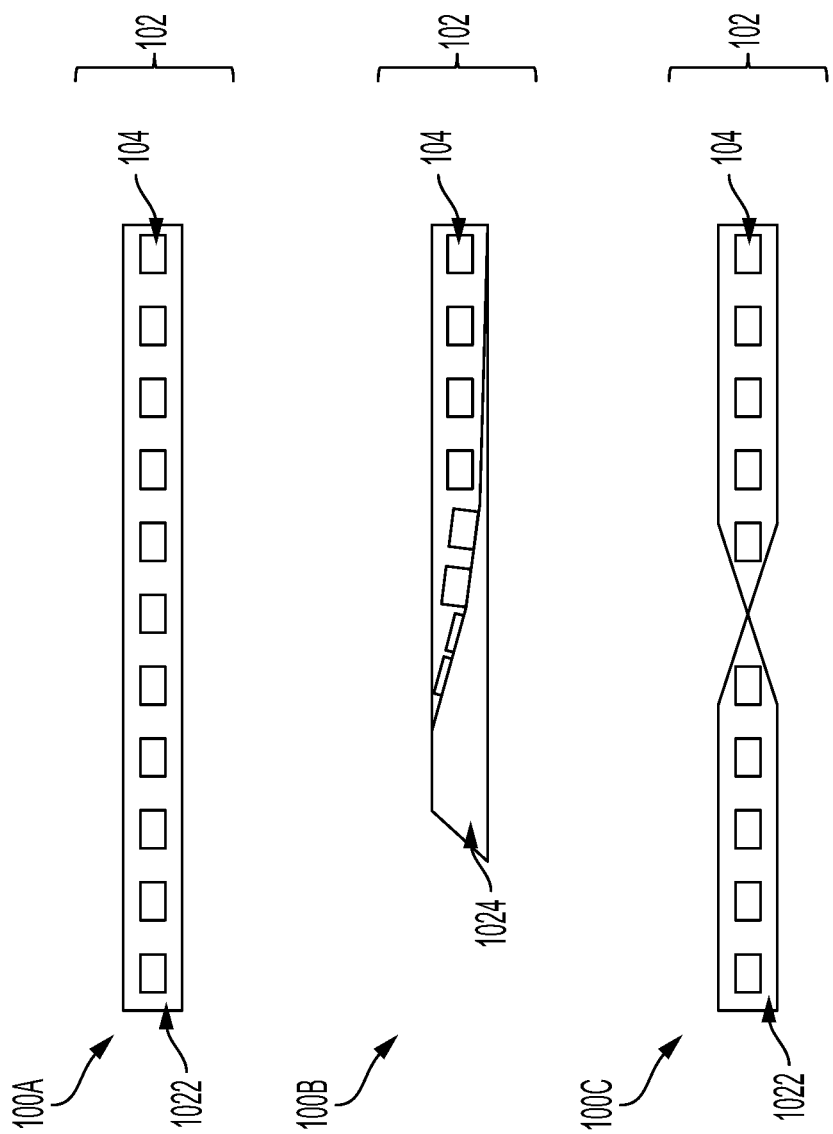
FIG. 2A is a top view illustration of the range of rotation of an exemplary flexible substrate configured in accordance with embodiments of the present disclosure.
Figure 2B:
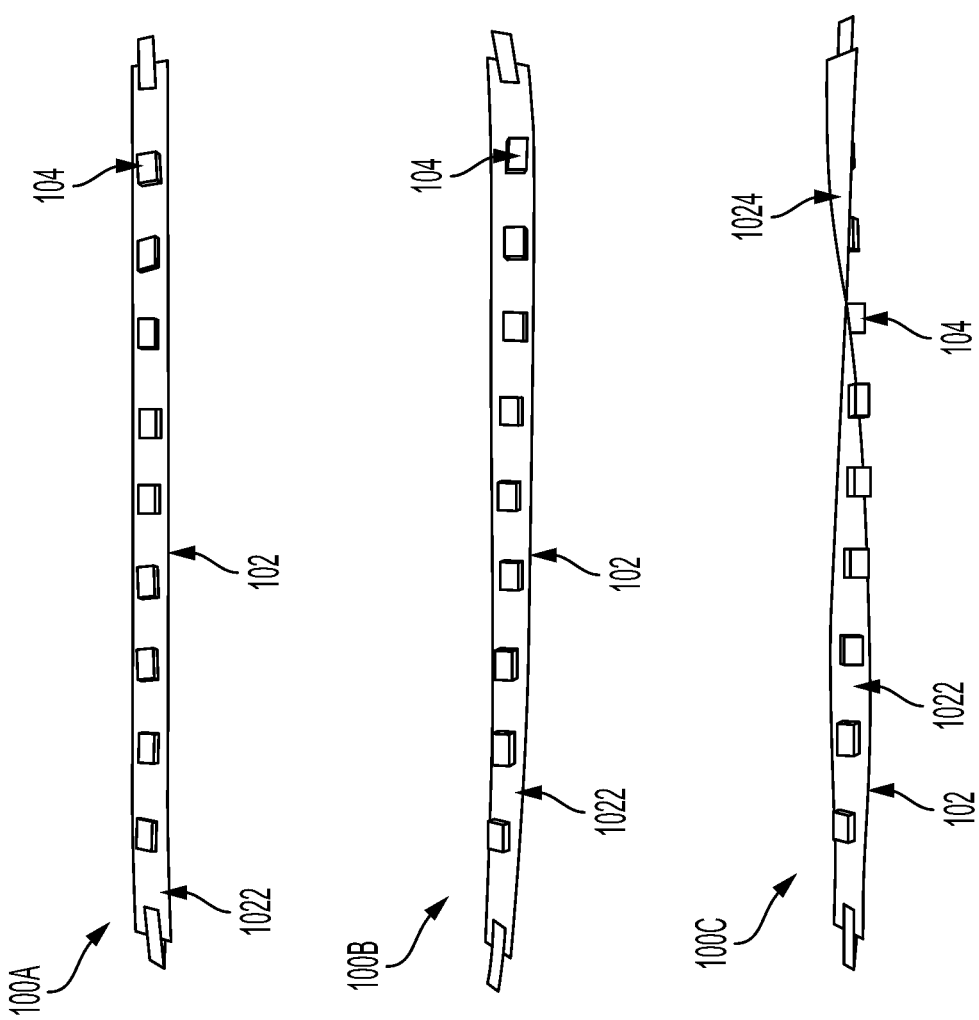
FIG. 2B-2C are perspective views of the range of rotation of an exemplary flexible substrate configured in accordance with embodiments of the present disclosure.
Figure 2C:
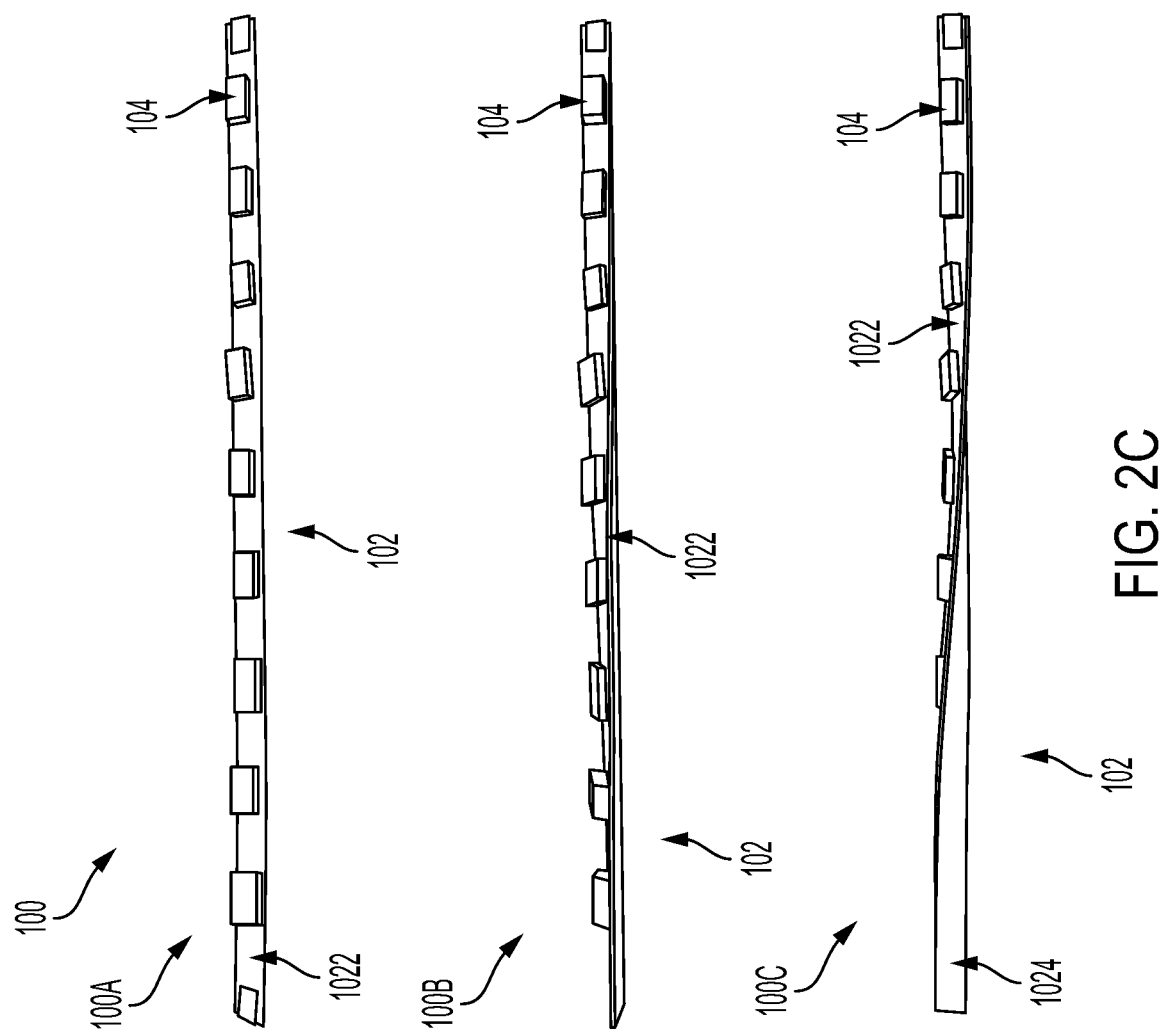

FIG. 2A is a top view illustration of the range of rotation of an exemplary flexible substrate 102 configured in accordance with embodiments of the present disclosure. FIGS. 2B-2C are perspective views of the range of rotation of an exemplary flexible substrate 102 configured in accordance with embodiments of the present disclosure. In embodiments, the flexible substrate 102 may be configured to be permanently flexible. That is, the flexible substrate 102 may retain the shape into which the flexible substrate 102 is twisted and/or rotated upon release of the torque causing the flexible substrate 102 to be twisted and/or rotated about a longitudinal axis parallel to the substrate length of the flexible substrate 102. The flexible substrate 102 may be configured to be twisted and/or rotated at least 360°. An exemplary flexible substrate 102 may be configured to be twisted and/or rotated within a range of 90° to 180°. In embodiments, exemplary flexible substrate 102 may be configured to be twisted and/or rotated within a range of 180° to 360°. In embodiments, exemplary flexible substrate 102 may be configured to be twisted and/or rotated within a range of 0° to 90°.

A relaxed or untwisted flexible substrate 102 is shown by 100A. The LED packages 104 are disposed facing in a uniform direction when the flexible substrate 102 is relaxed. A flexible substrate 102 twisted approximately 90° is shown by 100B. As shown, a first subset of LED packages 104 are disposed facing in a direction nearly perpendicular to a second subset of LED packages 104. A flexible substrate 102 twisted approximately 180° is shown by 100C. An example visual hallmark of a 180° rotation is that the second substrate surface 1024 now becomes visible. Further, a first subset of LED packages 104 are now disposed facing antiparallel (e.g., in the opposite direction) to a second subset of LED packages 104.

Figure 3:
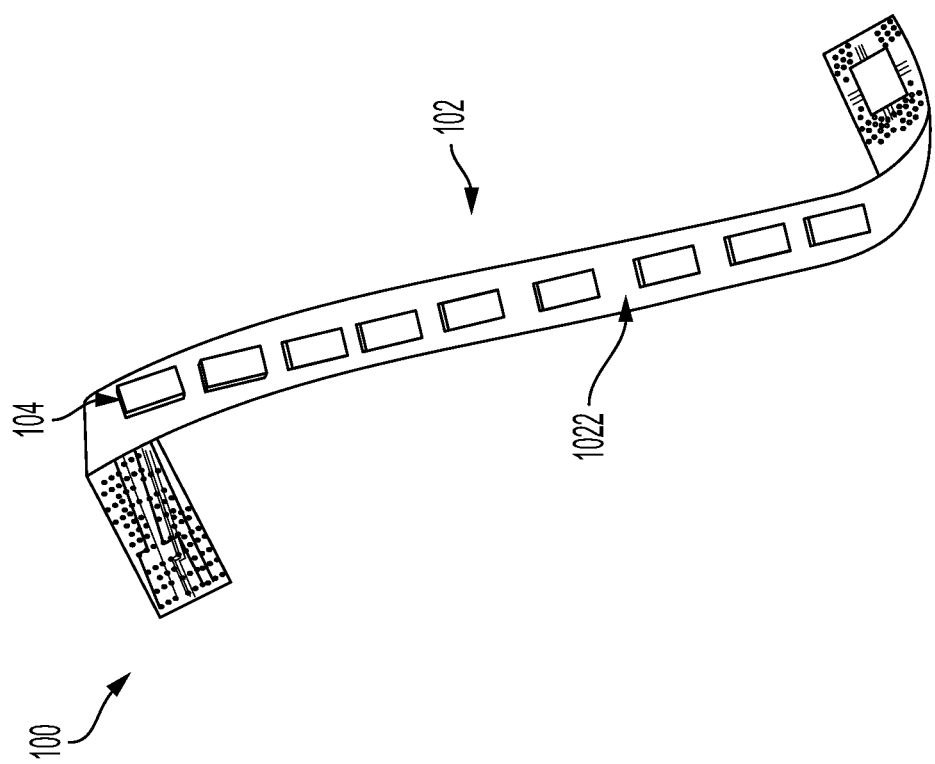
FIG. 3 is a perspective view of an exemplary flexible substrate configured in accordance with embodiments of the present disclosure.

FIG. 3 is a perspective view of an exemplary flexible substrate 102 configured in accordance with embodiments of the present disclosure. In embodiments, the exemplary flexible substrate 102 may further comprise a circuit board having a first side 1022 and a second side 1024. A plurality of LED packages 104 may be disposed on and/or electrically and mechanically couplable to the first side 1022. A plurality of leads/traces 302 may be disposed on and/or electrically and mechanically couplable to the first side 1022 or second side 1024 and with the plurality of LED packages 104. For example, the LED packages 104 may couplable to the first side 1022 by e.g., wire bonding or soldering. Driver circuitry 304 may be any driver circuitry suitable for converting blue-phosphor LEDs to white light with minimal energy lost as heat.

Figure 4:
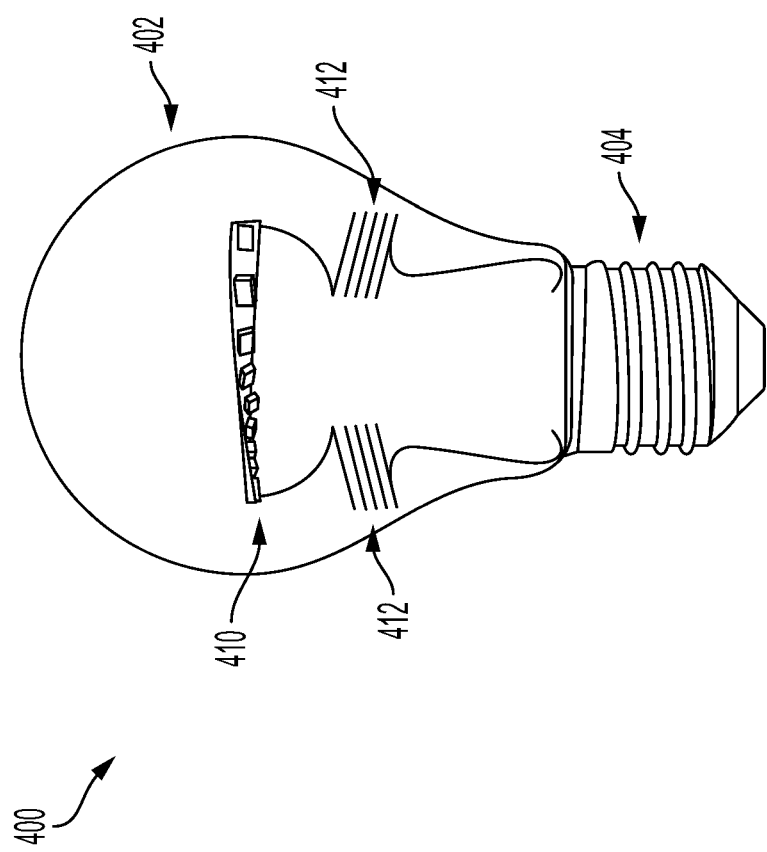
FIG. 4 illustrates an exemplary lighting apparatus in accordance with embodiments of the present disclosure.

FIG. 4 illustrates an exemplary lighting apparatus 400 configured in accordance with embodiments of the present disclosure. In embodiments, the lighting apparatus 400 comprises a transparent housing 402. The transparent housing 402 of certain embodiments may be configured to house a lighting emitting device 410. In embodiments, the lighting apparatus 400 comprises a base 404 for electrically coupling with a lighting socket. The lighting emitting device 410 of certain embodiments is electrically couplable with the base 404 and is housed within the transparent housing 402. The light emitting device 410 may be mounted within the transparent housing 402 with supporting wires 412. In embodiments, the lighting emitting device 410 comprises a flexible substrate 102. The flexible substrate 102 may be configured with metal contact ends. The metal contact ends 413 of the flexible substrate 102 may comprise electrical contact pads 414 for mechanical and electrical connection of the light emitting device 410 with the base 404 (see, e.g., FIGS. 5A-5B). For example, the supporting wires 412 may be electrically and mechanically couplable to the electrical contact pads 414 of the flexible substrate 102. The supporting wires 412 may thus couple the flexible substrate 102 of the light emitting device 410 with the base 404, via the electrical contact pads 414. Alternatively, the flexible substrate 102 may be coupled to a supporting structure independent of metal contact ends. The base 404 of certain embodiments may be configured as a variety of light bulb base types (e.g., Edison (e.g., E10, E11, E26), G4, G6.35, GY6.35, and the like). In embodiments, the base 404 is mechanically and/or electrically couplable to the circuit board 102 of the light emitting device 410 of certain embodiments, such that electrical current is provided to the light emitting device 410.

The flexibility of the flexible substrate 102 may be either temporary or permanent. When the flexibility is temporary, the flexible substrate 102 is electrically and mechanically coupled to the supporting wires 412 prior to having a suitable torque applied so as to configure it in a twisted orientation. Alternatively, a permanently flexible substrate 102 may be configured in a twisted orientation prior to being electrically and mechanically coupled to the supporting wires 412. For example, a mixture of phosphor and silicone/epoxy may first be applied to the flexible substrate 102. The flexible substrate 102 may then be configured to the desired rotation and, while maintaining the desired configuration, secured to the supporting wires 412. The flexible substrate 102 may therefore permanently maintain its configuration. Alternatively, the flexible substrate 102 may comprise material naturally conducive to maintaining permanent flexibility (e.g., copper).

Figure 5A:
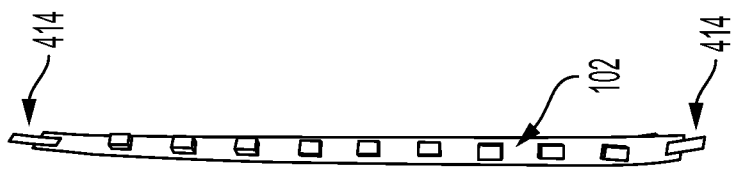
FIGS. 5A-5B are perspective views illustrating a flexible substrate according to various embodiments of the present disclosure.
Figure 5A:
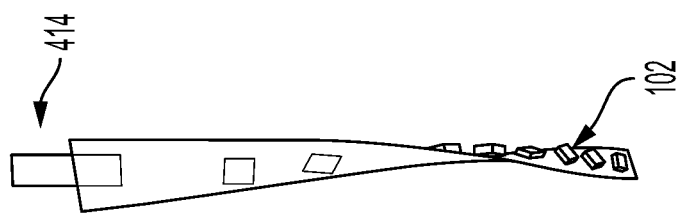
Figure 5A:
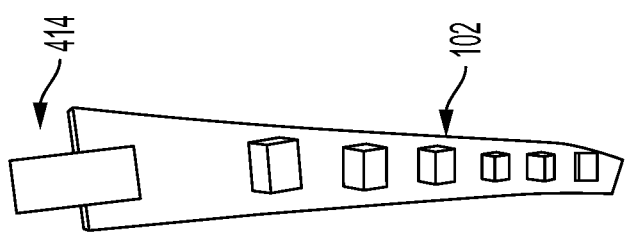
Figure 5B:
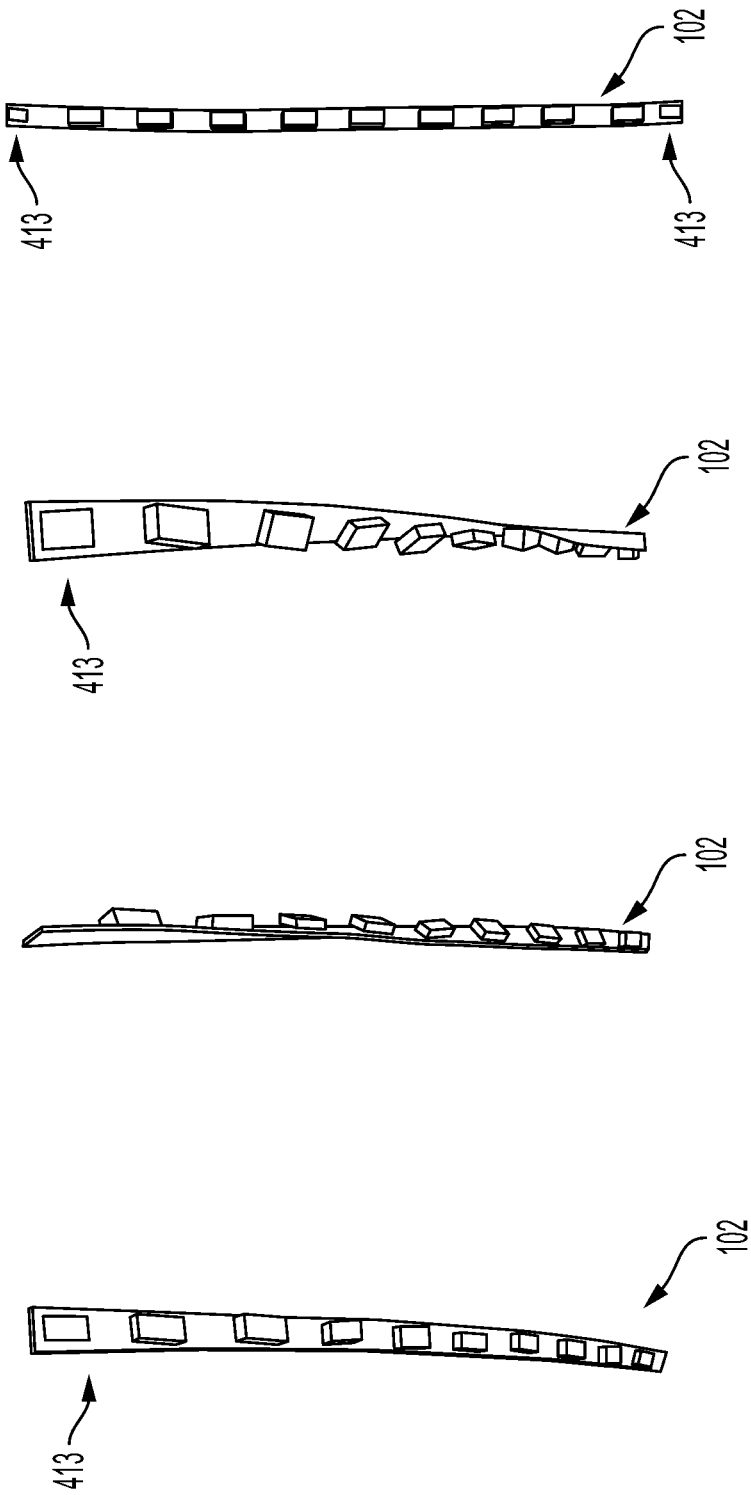

FIGS. 5A-5B are perspective views illustrating a flexible substrate 102 according to various embodiments. FIG. 5A illustrates a flexible substrate 102 configured with electrical contact pads 414. FIG. 5B illustrates a flexible substrate 102 configured with metal contact ends 413 that may or may not comprise electrical contact pads 414. In embodiments, the metal contact ends 413 may be suitable for soldering to the supporting wires 412.

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A light emitting device, comprising:
   a flexible substrate having a substrate length defining opposing ends of the flexible substrate, a first substrate surface and a second substrate surface, the flexible substrate being axially rotated by at least 90 degrees about a longitudinal axis that is parallel to and aligned with the substrate length;
   a plurality of LED packages disposed on the first substrate surface, wherein each LED package of the plurality of LED packages is configured to emit light outward from the flexible substrate; and
   one or more of a pair of metal contact ends or a pair of electrical contact pads positioned at the opposing ends of the flexible substrate,
   wherein the plurality of LED packages comprises phosphor-based LED packages and the flexible substrate is of a matching color as a phosphor color of the phosphor-based LED packages.

2. The light emitting device of claim 1, wherein a range of the axial twisting and rotation of the flexible substrate is either 90° to 180° or 180° to 360°.

3. The light emitting device of claim 1, wherein the flexible substrate is configured to radiate heat.

4. The light emitting device of claim 1, wherein the plurality of LED packages are configured to emit blue light.

5. The light emitting device of claim 1, wherein each LED package of the plurality of LED packages comprises an LED package width.

6. The light emitting device of claim 5, wherein a substrate width of the flexible substrate is one or more of equivalent to or exceeds at least one LED package width.

7. The light emitting device of claim 1, wherein the flexible substrate comprises polyamide.

8. The light emitting device of claim 6, wherein the substrate width is 1 to 2 mm and the substrate length is 5 cm.

9. A lighting apparatus, comprising:
   a transparent housing;
   a base for electrically coupling with a lighting socket; and
   a light emitting device electrically couplable with the base and housed within the transparent housing,
   wherein the light emitting device comprises:
      a flexible substrate having a substrate length, a first substrate surface, and a second substrate surface, the flexible substrate being axially rotated by at least 90 degrees about a longitudinal axis that is parallel to and aligned with the substrate length;
      a plurality of LED packages disposed on the first substrate surface, wherein each LED package of the plurality of LED packages is configured to emit light outward from the flexible substrate; and
      one or more of a pair of metal contact ends or a pair of electrical contact pads positioned at the opposing ends of the flexible substrate; and
   wherein the plurality of LED packages comprises phosphor-based LED packages and the flexible substrate is of a matching color as a phosphor color of the phosphor-based LED packages.

10. The lighting apparatus of claim 9, wherein the base comprises one or more of an Edison-type base, a G4-type base, a G6.35-type base, a G9-type base.

11. The lighting apparatus of claim 9, wherein the base is mechanically and/or electrically couplable to driver circuitry such that electrical current is provided to the light emitting device.

12. The lighting apparatus of claim 9, wherein each LED package of the plurality of LED packages comprises an LED package width and wherein a substrate width of the flexible substrate is one or more of equivalent to or exceeds at least one LED package width.

13. The lighting apparatus of claim 9, wherein a range of the axial rotation of the flexible substrate is either 90° to 180° or 180° to 360°.

14. The lighting apparatus of claim 9, wherein the flexible substrate further comprises:
   driver circuitry disposed on the second substrate surface of the flexible substrate; and
   a plurality of leads/traces disposed on the second substrate surface of the flexible substrate and electrically couplable with the plurality of LED packages and the driver circuitry.

15. The light emitting device of claim 1, wherein the flexible substrate further comprises:
   driver circuitry disposed on the second substrate surface of the flexible substrate; and
   a plurality of leads/traces disposed on the second substrate surface of the flexible substrate and electrically couplable with the plurality of LED packages and the driver circuitry.

* * * * *

UNITED STATES PATENT AND TRADEMARK OFFICE
CERTIFICATE OF CORRECTION

PATENT NO. : 11,876,042 B2
APPLICATION NO. : 16/983747
DATED : January 16, 2024
INVENTOR(S) : John D. Mitchell, Jr.

It is certified that error appears in the above-identified patent and that said Letters Patent is hereby corrected as shown below:

On the Title Page

In Column 1, Item (72), Inventor, Line 1, delete "John Mitchell," and insert -- John D. Mitchell, Jr. --, therefor.

Signed and Sealed this
Sixteenth Day of April, 2024

Katherine Kelly Vidal
*Director of the United States Patent and Trademark Office*